US012646226B2

(12) United States Patent
Finlay et al.

(10) Patent No.: US 12,646,226 B2
(45) Date of Patent: Jun. 2, 2026

(54) METHODS AND SYSTEMS OF TRAINING NEURAL NETWORKS FOR LOSSY IMAGE OR VIDEO ENCODING, TRANSMISSION AND DECODING

(71) Applicant: InterDigital VC Holdings, Inc., Wilmington, DE (US)

(72) Inventors: Chris Finlay, London (GB); Jonathan Rayner, London (GB); Jan Xu, London (GB); Christian Besenbruch, London (GB); Arsalan Zafar, London (GB); Sebastjan Cizel, London (GB); Vira Koshkina, London (GB)

(73) Assignee: InterDigital VC Holdings, Inc., Wilmington, DE (US)

( * ) Notice: Subject to any disclaimer, the term of this patent is extended or adjusted under 35 U.S.C. 154(b) by 0 days.

(21) Appl. No.: 18/458,473

(22) Filed: Aug. 30, 2023

(65) Prior Publication Data

US 2024/0070925 A1 Feb. 29, 2024

Related U.S. Application Data

(63) Continuation of application No. PCT/EP2022/080015, filed on Oct. 26, 2022.

(30) Foreign Application Priority Data

Oct. 26, 2021 (GB) ...................................... 2115399

(51) Int. Cl.

*G06N 20/00* (2019.01)
*G06F 30/27* (2020.01)

(Continued)

(52) U.S. Cl.

CPC .............. *G06T 9/002* (2013.01); *G06F 30/27* (2020.01); *G06N 3/045* (2023.01); *G06N 3/08* (2013.01); *G06N 20/00* (2019.01); *G06T 3/4046* (2013.01)

(58) Field of Classification Search

None

See application file for complete search history.

(56) References Cited

U.S. PATENT DOCUMENTS

| | | | | |
|---|---|---|---|---|
| 11,252,417 | B2 * | 2/2022 | Andreopoulos | H04N 19/182 |
| 12,223,426 | B2 * | 2/2025 | Sung | G06N 3/0495 |

(Continued)

FOREIGN PATENT DOCUMENTS

| | | | | | |
|---|---|---|---|---|---|
| CN | 110868598 | A * | 3/2020 | | G06N 3/0454 |
| WO | WO-2021097421 | A1 * | 5/2021 | | G06N 3/0454 |
| WO | WO-2022106014 | A1 * | 5/2022 | | H04N 19/132 |

OTHER PUBLICATIONS

STIC Provided translation of CN-110868598 A relied upon in Rejection of the claims. (Year: 2020).*

(Continued)

*Primary Examiner* — Tyler W. Sullivan

(74) *Attorney, Agent, or Firm* — Condo Roccia Koptiw LLP

(57) ABSTRACT

A method of training one or more neural networks, the one or more neural networks being for use in lossy image or video encoding, transmission and decoding. The method comprises encoding an input image using a first neural network to produce a latent representation and decoding the latent representation using a second neural network to produce an output image. At least one of the plurality of layers of the first or second neural network comprises a transformation and a function based on an output of the (Continued)

transformation is use to update the parameters of the first neural network and the second neural network.

7 Claims, 8 Drawing Sheets

(51) Int. Cl.

| | |
|---|---|
| ***G06N 3/045*** | (2023.01) |
| ***G06N 3/08*** | (2023.01) |
| ***G06T 3/4046*** | (2024.01) |
| ***G06T 9/00*** | (2006.01) |

(56) References Cited

U.S. PATENT DOCUMENTS

2019/0046068 A1* 2/2019 Ceccaldi ................ A61B 5/055
2023/0074979 A1* 3/2023 Brehmer .................. G06N 3/08

OTHER PUBLICATIONS

Changyue Ma et al, "A Cross Channel Context Model for Latents in Deep Image Compression", arxiv.org, Cornell University Library, 201 Olin Library Cornell University Ithaca, NY 14853,Mar. 4, 2021 (Mar. 4, 2021).
Caron, M., Bojanowski, P., Joulin, A. & Douze, M. (2018) Deep Clustering for Unsupervised Learning of Visual Learning.
Da Silva Renam C et al, "Distortion scalable learned image compression", 2019 IEEE 21st International Workshop on Multimedia Signal Processing (MMSP), IEEE,Sep. 27, 2019 (Sep. 27, 2019), p. 1-6.
Dosovitskiy, A., Beyer, L., Kolesnikov, A., Weissenborn, D., Zhai, X., Unterthiner, T., Dehghani, M., Minderer, M., Heigold, G., Gelly, S., Uszkoreit, J. & Houlsby, N. (2020) An Image is Worth 16x16 Words: Transformers for Image Recognition at Scale.
Jang, E., Gu, S. & Poole, B. (2016) Categorical Reparameterization with Gumbel-Softmax.
Lin Chaoyi et al, "A Spatial RNN Codec for End-to-End Image Compression", 2020 IEEE/CVF Conference on Computer Vision and Pattern Recognition (CVPR), IEEE,Jun. 13, 2020 (Jun. 13, 2020), p. 13266-13274.
Michele Benzi, Gene H. Golub, and Jörg Liesen. Numerical solution of saddle point problems. Acta Numerica, 14:1-137, May 2005.
Un Han et al, "Deep Probabilistic Video Compression", arxiv.org, Cornell University Library, 201 Olin Library Cornell University Ithaca, NY 14853,Oct. 5, 2018 (Oct. 5, 2018).
Wu, B., Xu, C., Dai, X., Wan, A., Zhang, P., Yan, Z., Tomizuka, M., Gonzalez, J., Keutzer, K. & Vajda, P. (2020) Visual Transformers: Token-based Image Representation and Processing for Computer Vision.
Balle et al., "End-to-end Optimized Image Compression," Conf. paper at ICLR 2017; arXiv:1611.01704v3 (2017).
Balle et al., "Variational image compression with a scale hyperprior," arXiv:1802.01436v2 (2018).

* cited by examiner

METHODS AND SYSTEMS OF TRAINING NEURAL NETWORKS FOR LOSSY IMAGE OR VIDEO ENCODING, TRANSMISSION AND DECODING

CROSS-REFERENCE TO RELATED APPLICATIONS

This application is a continuation of International Application No. PCT/EP2022/080015, filed Oct. 26, 2022, which claims priority to GB Application No. 2115399.4, filed Oct. 26, 2021, the entire contents of which being fully incorporated herein by reference.

FIELD OF THE INVENTION

This invention relates to a method and system for lossy image or video encoding, transmission and decoding, a method, apparatus, computer program and computer readable storage medium for lossy image or video encoding and transmission, and a method, apparatus, computer program and computer readable storage medium for lossy image or video receipt and decoding.

There is increasing demand from users of communications networks for images and video content. Demand is increasing not just for the number of images viewed, and for the playing time of video; demand is also increasing for higher resolution content. This places increasing demand on communications networks and increases their energy use because of the larger amount of data being transmitted.

To reduce the impact of these issues, image and video content is compressed for transmission across the network. The compression of image and video content can be lossless or lossy compression. In lossless compression, the image or video is compressed such that all of the original information in the content can be recovered on decompression. However, when using lossless compression there is a limit to the reduction in data quantity that can be achieved. In lossy compression, some information is lost from the image or video during the compression process. Known compression techniques attempt to minimise the apparent loss of information by the removal of information that results in changes to the decompressed image or video that is not particularly noticeable to the human visual system.

Artificial intelligence (AI) based compression techniques achieve compression and decompression of images and videos through the use of trained neural networks in the compression and decompression process. Typically, during training of the neutral networks, the difference between the original image and video and the compressed and decompressed image and video is analyzed and the parameters of the neural networks are modified to reduce this difference while minimizing the data required to transmit the content. However, AI based compression methods may achieve poor compression results in terms of the appearance of the compressed image or video or the amount of information required to be transmitted.

According to the present invention there is provided a method of training one or more neural networks, the one or more neural networks being for use in lossy image or video encoding, transmission and decoding, the method comprising the steps of:

receiving an input image at a first computer system;

encoding the input image using a first neural network to produce a latent representation;

transmitting the latent representation to a second computer system; and decoding the latent representation using a second neural network to produce an output image, wherein the output image is an approximation of the input image;

wherein the first neural network and the second neural network each comprise a plurality of layers;

at least one of the plurality of layers of the first or second neural network comprises a transformation; and the method further comprises the steps of:

evaluating a difference between the output image and the input image and evaluating a function based on an output of the transformation;

updating the parameters of the first neural network and the second neural network based on the evaluated difference and the evaluated function; and repeating the above steps using a first set of input images to produce a first trained neural network and a second trained neural network.

The function may be based on a plurality of outputs of a plurality of transformations, wherein each transformation is in a different layer of the plurality of layers of the first or second neural network.

The contribution of each of the plurality of outputs to the evaluation of the function may be scaled by a predetermined value.

The output of the transformation may comprises a plurality of values; and the function may be based on the square of each of the plurality of values.

The output of the transformation may comprises a plurality of values; and the function may be based on the absolute value of each of the plurality of values.

The function may be based on the square and the absolute value of each of the plurality of values.

The function may be based on the average of each of the plurality of values.

The contribution of the square and the absolute value on the evaluation of the function may be scaled by a predetermined value.

The function may be additionally based on the variance of the plurality of values.

The contribution of the evaluated function to the update to the parameters of the first neural network and the second neural network may be scaled by a predetermined value.

The contribution of the evaluated function to the update to the parameters of the first neural network and the second neural network may be scaled by a value; and the value may be additionally updated in at least one repetition of the steps of the method.

The at least one of the plurality of layers of the first or second neural network may comprise an additional transformation applied after the transformation; and the parameters of the linear transformation may be additionally updated based on the evaluated difference and the evaluated function;

wherein the function is not based on the output of the additional transformation.

SUMMARY OF THE INVENTION

According to the present invention there is provided a method for lossy image or video encoding, transmission and decoding, the method comprising the steps of:

receiving an input image at a first computer system;

encoding the input image using a first trained neural network to produce a latent representation;

transmitting the latent representation to a second computer system;

decoding the latent representation using a second trained neural network to produce an output image, wherein the output image is an approximation of the input image;

wherein the first trained neural network and the second trained neural network has been trained according to the method above.

According to the present invention there is provided method for lossy image or video encoding and transmission, the method comprising the steps of:

receiving an input image at a first computer system;

encoding the input image using a first trained neural network to produce a latent representation; and transmitting the latent representation;

wherein the first trained neural network has been trained according to the method above.

According to the present invention there is provided method for lossy image or video receipt and decoding, the method comprising the steps of:

receiving the latent representation transmitted according to the method above at a second computer system; and decoding the latent representation using a second trained neural network to produce an output image, wherein the output image is an approximation of the input image;

wherein the second trained neural network has been trained according to the method above.

According to the present invention there is provided a method for lossy image and video encoding, transmission and decoding, the method comprising the steps of:

receiving an input image at a first computer system;

encoding the input image using a first trained neural network to produce a latent representation;

performing a first operation on the latent representation to obtain a residual latent;

transmitting the residual latent to a second computer system;

performing a second operation on the latent residual to obtain a retrieved latent representation, wherein the second operation comprises performing an operation on previously obtained pixels of the retrieved latent; and decoding the retrieved latent representation using a second trained neural network to produce an output image, wherein the output image is an approximation of the input image.

The first operation may be a linear operation.

The first operation may be a non-linear operation.

The first operation may be a differentiable operation.

The first operation may be a non-differentiable operation.

The operation performed on previously obtained pixels of the retrieved latent may comprise a matrix operation.

At least one of the operations may comprise an explicit iterative operation.

At least one of the operations may comprise an implicit iterative operation.

The implicit iterative operation may comprise the calculation of a rounding function; and an approximation may be used to determined the resolvent of the rounding function.

The second operation may comprise an iterative operation comprising operator splitting.

The iterative operation may comprise defining at least two variables based on the latent representation and the retrieved latent and performing an operation on each of the at least two variables in turn.

The iterative operation may comprise defining at least two further variables each corresponding to a range of one of the at least two variables and additionally performing an operation on each of the at least two further variables in turn.

The iterative operation may further comprise a step between each iterative step where one of the at least two variables is modified based on a difference between the value of the variable and the value of the variable in the previous iterative step.

When the matrix operation is negative definite, each operation may be a descending step.

When the matrix operation is singular, an additional term may be included in the iterative method to obtain a unique solution to the second operation.

The second operation may comprise performing a conditioning operation on the matrix operation.

The first operation may comprise a quantisation operation.

The first operation may additionally be based on a latent corresponding to the retrieved latent representation; and the latent representation and the latent corresponding to the retrieved latent representation may be equal.

The first operation may be additionally based on a latent corresponding to the retrieved latent representation; and the latent representation and the latent corresponding to the retrieved may differ from each other by a predetermined error value.

The method may further comprise the steps of:

encoding the latent representation using a fourth trained neural network to produce a hyper-latent representation;

transmitting the quantized hyper-latent to the second computer system; and decoding the quantized hyper-latent using a fifth trained neural network, wherein the operation performed on previously obtained pixels of the retrieved latent is based on the output of the fifth trained neural network.

According to the present invention there is provided a method of training one or more neural networks, the one or more neural networks being for use in lossy image or video encoding, transmission and decoding, the method comprising the steps of:

receiving an input image at a first computer system;

encoding the input image using a first neural network to produce a latent representation;

performing a first operation on the latent representation to obtain a residual latent;

performing a second operation on the latent residual to obtain a retrieved latent representation, wherein the second operation comprises performing an operation on previously obtained pixels of the retrieved latent;

decoding the quantized latent using a second neural network to produce an output image, wherein the output image is an approximation of the input image;

evaluating a difference between the output image and the input image;

updating the parameters of the first neural network and the second neural network based on the evaluated difference; and repeating the above steps using a first set of input images to produce a first trained neural network and a second trained neural network.

The method may further comprise the steps of:

encoding the latent representation using a fourth neural network to produce a hyper-latent representation;

performing a quantization process on the hyper-latent representation to produce a quantized hyper-latent;

transmitting the quantized hyper-latent to the second computer system; and decoding the quantized hyper-latent using a fifth neural network, wherein the operation performed on previously obtained pixels of the retrieved latent is based on the output of the fifth trained neural network;

wherein the parameters of the fourth neural network and the fifth neural network are additionally updated based on the evaluated difference to produce a fourth trained neural network and a fifth trained neural network.

According to the present invention there is provided a method for lossy image or video encoding and transmission, the method comprising the steps of:

receiving an input image at a first computer system;

encoding the input image using a first trained neural network to produce a latent representation;

performing a first operation on the latent representation to obtain a residual latent;

transmitting the residual latent.

According to the present invention there is provided a method for lossy image or video receipt and decoding, the method comprising the steps of:

receiving the residual latent transmitted according to the method above at a second computer system;

performing a second operation on the latent residual to obtain a retrieved latent representation, wherein the second operation comprises performing an operation on previously obtained pixels of the retrieved latent; and decoding the retrieved latent representation using a second trained neural network to produce an output image, wherein the output image is an approximation of the input image.

According to the present invention there is provided a method for lossy image and video encoding, transmission and decoding, the method comprising the steps of:

receiving an input image at a first computer system;

encoding the input image using a first trained neural network to produce a latent representation;

performing a first operation on the latent representation to obtain a residual latent, wherein the first operation comprises performing a quantization process, wherein the sizes of the bins used in the quantization process are based on the input image;

transmitting the residual latent to a second computer system;

performing a second operation on the latent residual to obtain a retrieved latent representation, wherein the second operation comprises performing an operation on previously obtained pixels of the retrieved latent; and decoding the retrieved latent representation using a second trained neural network to produce an output image, wherein the output image is an approximation of the input image.

At least one of the first operation and the second operation may comprise the solving of an implicit equation system.

The sizes of the bins may be different between at least two of the pixels or channels of the latent representation.

The quantization process may comprise performing an operation on the value of each pixel of the latent representation corresponding to the bin size assigned to that pixel.

The quantisation process may comprise subtracting a mean value of the latent representation from each pixel of the latent representation.

The quantisation process may comprise a rounding function.

The operation performed on previously obtained pixels of the retrieved latent may comprise a matrix operation.

The matrix defining the matrix operation may have at least one of the following properties: upper triangular, lower triangular, banded, monotone, symmetric or bounding its eigenvalues.

The quantisation process may comprise a third trained neural network.

The method may further comprising the steps of:

encoding the latent representation using a fourth trained neural network to produce a hyper-latent representation;

performing a quantization process on the hyper-latent representation to produce a quantized hyper-latent;

transmitting the quantized hyper-latent to the second computer system; and decoding the quantized hyper-latent using a fifth trained neural network to obtain the sizes of the bins;

wherein the decoding of the quantized latent uses the obtained sizes of the bins; and the operation performed on previously obtained pixels of the retrieved latent is based on the output of the fifth trained neural network.

The output of the fifth trained neural network may be processed by a further function to obtain the sizes of the bins.

The further function may be a sixth trained neural network.

The sizes of the bins used in the quantization process of the hyper-latent representation may be based on the input image.

According to the present invention there is provided a method of training one or more neural networks, the one or more neural networks being for use in lossy image or video encoding, transmission and decoding, the method comprising the steps of:

receiving an input image at a first computer system;

encoding the input image using a first neural network to produce a latent representation;

performing a first operation on the latent representation to obtain a residual latent, wherein the first operation comprises performing a quantization process, wherein the sizes of the bins used in the quantization process are based on the input image;

transmitting the residual latent to a second computer system;

performing a second operation on the latent residual to obtain a retrieved latent representation, wherein the second operation comprises performing an operation on previously obtained pixels of the retrieved latent; and decoding the retrieved latent representation using a second neural network to produce an output image, wherein the output image is an approximation of the input image;

evaluating a difference between the output image and the input image;

updating the parameters of the first neural network and the second neural network based on the evaluated difference; and repeating the above steps using a first set of input images to produce a first trained neural network and a second trained neural network.

The method may further comprise the steps of:

encoding the latent representation using a third neural network to produce a hyper-latent representation;

performing a quantization process on the hyper-latent representation to produce a quantized hyper-latent;

transmitting the quantized hyper-latent to the second computer system; and decoding the quantized hyper-latent using a fourth neural network to obtain the sizes of the bins;

wherein the decoding of the quantized latent uses the obtained bin sizes;

the operation performed on previously obtained pixels of the retrieved latent is based on the output of the fourth neural network; and the parameters of the third neural network and the fourth neural network are additionally updated based on the evaluated difference to obtain a third trained neural network and a fourth trained neural network.

The quantisation process may comprise a first quantisation approximation.

The method may further comprise the step of determining a rate of the lossy image or video encoding, transmission and decoding process;

the parameters of the neural networks are additionally updated based on the determined rate;

a second quantisation approximation is used to determine the rate of the compression process; and the second quantisation approximation is different to the first quantisation approximation.

The updating of the parameters of the neural networks may comprise the steps of:

evaluating a loss function based on a difference between the output image and the input image;

evaluating a gradient of the loss function; and back-propagating the gradient of the loss function through the neural networks;

wherein a third quantisation approximation is used during back-propagation of the gradient of the loss function; and the third quantisation approximation is the same approximation as the first quantisation approximation.

According to the present invention there is provided method for lossy image or video encoding and transmission, the method comprising the steps of:

receiving an input image at a first computer system;

encoding the input image using a first trained neural network to produce a latent representation;

performing a first operation on the latent representation to obtain a residual latent, wherein the first operation comprises performing a quantization process, wherein the sizes of the bins used in the quantization process are based on the input image; and transmitting the residual latent.

According to the present invention there is provided method for lossy image or video receipt and decoding, the method comprising the steps of:

receiving the residual latent transmitted according to the method above at a second computer system;

performing a second operation on the latent residual to obtain a retrieved latent representation, wherein the second operation comprises performing an operation on previously obtained pixels of the retrieved latent; and decoding the retrieved latent representation using a second trained neural network to produce an output image, wherein the output image is an approximation of the input image.

According to the present invention there is provided method for lossy image and video encoding, transmission and decoding, the method comprising the steps of:

receiving an input image at a first computer system;

assigning the input image to a cluster using a clustering algorithm;

encoding the input image using a first trained neural network to produce a latent representation;

transmitting the latent representation to a second computer system; and decoding the latent representation using a second trained neural network to produce an output image, wherein the output image is an approximation of the input image.

wherein at least one of the first trained neural network and the second trained neural network is selected from a first plurality of trained neural networks and a second plurality of trained neural networks respectively based on the assigned cluster.

The first and second network may be each selected based on the assigned cluster.

The input image may be a sub-image obtained from an initial image.

The initial image may be divided into a plurality of input images of the same size; and each of the plurality of input images may be encoded, transmitted and decoded according to the method for lossy image and video encoding, transmission and decoding.

The plurality of latent representations may be combined to form a combined latent prior to transmission to the second computer system and divided to obtain the received plurality of latent representations prior to decoding using the second trained neural network.

One of plurality of first neural networks and one of the plurality of second neural networks may be not associated with any of the clusters of the clustering algorithm.

The clustering algorithm may comprise at least one of following algorithms: k-means, mini-batch k-means, affinity propagation, mean-shift, spectral clustering, ward hierarchical clustering, agglomerative clustering, Density-Based Spatial Clustering of Applications with Noise (DBSCAN), Ordering Points To Identify the Clustering Structure (OPTICS), gaussian mixtures, Balanced Iterative Reducing and Clustering using Hierarchies (BIRCH), deep clustering and a trained neural network.

The clustering performed by the clustering algorithm may be based on at least one of following so properties of at least one channel the input image: the mean, the variance, the histogram probabilities and the power spectral density.

The clustering performed by the clustering algorithm may be based on the output of a third trained neural network that receives the input image as an input.

Each of the first plurality of trained neural networks may have the same architecture.

Each of the second plurality of trained neural networks may have same architecture.

The clusters of the clustering algorithm may be based on the media category of the input image.

T the clusters of the clustering algorithm may be based on a sub-category of the media category of the input image.

According to the present invention there is provided method of training one or more algorithms, the one or more algorithms being for use in lossy image or video encoding, transmission and decoding, the method comprising the steps of:

receiving an input image at a first computer system;

assigning the input image to a cluster using a clustering algorithm;

encoding the input image using a first neural network to produce a latent representation;

decoding the latent representation using a second neural network to produce an output image, wherein the output image is an approximation of the input image;

wherein at least one of the first trained neural network and the second trained neural network is selected from a first plurality of neural networks and a second plurality of neural networks respectively based on the assigned cluster; and the method further comprises the steps of:

evaluating a difference between the output image and the input image;

updating the parameters of the first neural network and the second neural network based on the evaluated difference; and repeating the above steps using a first set of input images to produce a first plurality of trained neural networks and a second plurality of trained neural networks.

The clustering performed by the clustering algorithm may be based on the output of a third neural network that receives the input image as an input; and the parameters of the third neural network are additionally updated based on the evaluated difference.

According to the present invention there is provided method for lossy image or video encoding and transmission, the method comprising the steps of:

receiving an input image at a first computer system;

assigning the input image to a cluster using a clustering algorithm;

encoding the input image using a first trained neural network to produce a latent representation;

transmitting the latent representation;

wherein the first trained neural network is selected from a first plurality of trained neural networks based on the assigned cluster.

According to the present invention there is provided a method for lossy image or video receipt and decoding, the method comprising the steps of:

receiving the latent transmitted according to the method above at a second computer system;

decoding the latent representation using a second trained neural network to produce an output image, wherein the output image is an approximation of the input image;

wherein the second trained neural network is selected from a second plurality of trained neural networks based on the assigned cluster.

According to the present invention there is provided data processing system configured to perform any of the methods above.

According to the present invention there is provided a data processing apparatus configured to perform any of the methods above.

According to the present invention there is provided a computer program comprising instructions which, when the program is executed by a computer, cause the computer to carry out any of the methods above.

According to the present invention there is provided a computer-readable storage medium comprising instructions which, when executed by a computer, cause the computer to carry out the method of any of the methods above.

BRIEF DESCRIPTION OF THE DRAWINGS

Aspects of the invention will now be described by way of examples, with reference to the following figures in which.

DETAILED DESCRIPTION OF THE INVENTION

Figure 1:
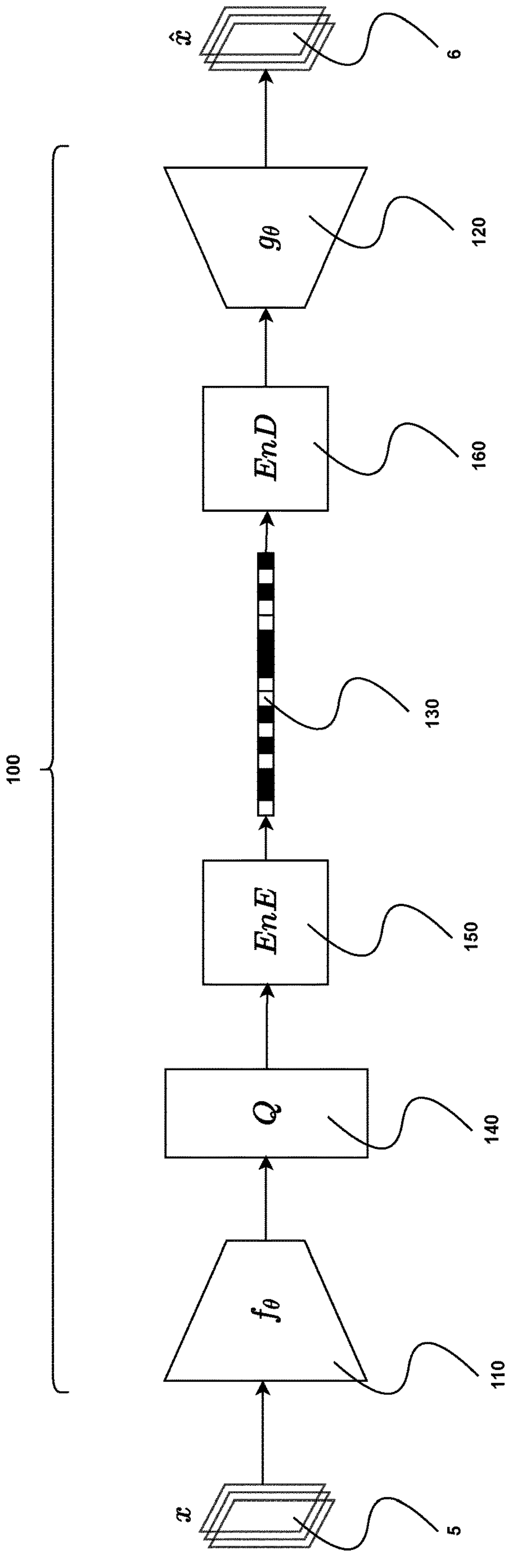
FIG. 1 illustrates an example of an image or video compression, transmission and decompression pipeline.

Compression processes may be applied to any form of information to reduce the amount of data, or file size, required to store that information. Image and video information is an example of information that may be compressed. The file size required to store the information, particularly during a compression process when referring to the compressed file, may be referred to as the rate. In general, compression can be lossless or lossy. In both forms of compression, the file size is reduced. However, in lossless compression, no information is lost when the information is compressed and subsequently decompressed. This means that the original file storing the information is fully reconstructed during the decompression process. In contrast to this, in lossy compression information may be lost in the compression and decompression process and the reconstructed file may differ from the original file. Image and video files containing image and video data are common targets for compression. JPEG, JPEG2000, AVC, HEVC and AVI are examples of compression processes for image and/or video files.

In a compression process involving an image, the input image may be represented as x. The data representing the image may be stored in a tensor of dimensions H×W×C, where H represents the height of the image, W represents the width of the image and C represents the number of channels of the image. Each H×W data point of the image represents a pixel value of the image at the corresponding location. Each channel C of the image represents a different component of the image for each pixel which are combined when the image file is displayed by a device. For example, an image file may have 3 channels with the channels representing the red, green and blue component of the image respectively. In this case, the image information is stored in the RGB colour space, which may also be referred to as a model or a format.

Other examples of colour spaces or formats include the CMKY and the YCbCr colour models. However, the channels of an image file are not limited to storing colour information and other information may be represented in the channels. As a video may be considered a series of images in sequence, any compression process that may be applied to an image may also be applied to a video. Each image making up a video may be referred to as a frame of the video.

The output image may differ from the input image and may be represented by x. The difference between the input image and the output image may be referred to as distortion or a difference in image quality. The distortion can be measured using any distortion function which receives the input image and the output image and provides an output which represents the difference between input image and the output image in a numerical way. An example of such a method is using the mean square error (MSE) between the pixels of the input image and the output image, but there are many other ways of measuring distortion, as will be known to the person skilled in the art. The distortion function may comprise a trained neural network.

Typically, the rate and distortion of a lossy compression process are related. An increase in the rate may result in a decrease in the distortion, and a decrease in the rate may result in an increase in the distortion. Changes to the distortion may affect the rate in a corresponding manner. A relation between these quantities for a given compression technique may be defined by a rate-distortion equation.

AI based compression processes may involve the use of neural networks. A neural network is an operation that can be performed on an input to produce an output. A neural network may be made up of a plurality of layers. The first layer of the network receives the input. One or more operations may be performed on the input by the layer to produce an output of the first layer. The output of the first layer is then passed to the next layer of the network which may perform one or more operations in a similar way. The output of the final layer is the output of the neural network.

Each layer of the neural network may be divided into nodes. Each node may receive at least part of the input from the previous layer and provide an output to one or more nodes in a subsequent layer. Each node of a layer may perform the one or more operations of the layer on at least part of the input to the layer. For example, a node may receive an input from one or more nodes of the previous layer. The one or more operations may include a convolution, a weight, a bias and an activation function. Convolution operations are used in convolutional neural networks. When a convolution operation is present, the convolution may be performed across the entire input to a layer. Alternatively, the convolution may be performed on at least part of the input to the layer.

Each of the one or more operations is defined by one or more parameters that are associated with each operation. For example, the weight operation may be defined by a weight matrix defining the weight to be applied to each input from each node in the previous layer to each node in the present layer. In this example, each of the values in the weight matrix is a parameter of the neural network. The convolution may be defined by a convolution matrix, also known as a kernel. In this example, one or more of the values in the convolution matrix may be a parameter of the neural network. The activation function may also be defined by values which may be parameters of the neural network. The parameters of the network may be varied during training of the network.

Other features of the neural network may be predetermined and therefore not varied during training of the network. For example, the number of layers of the network, the number of nodes of the network, the one or more operations performed in each layer and the connections between the layers may be predetermined and therefore fixed before the training process takes place. These features that are predetermined may be referred to as the hyperparameters of the network. These features are sometimes referred to as the architecture of the network.

To train the neural network, a training set of inputs may be used for which the expected output, sometimes referred to as the ground truth, is known. The initial parameters of the neural network are randomized and the first training input is provided to the network. The output of the network is compared to the expected output, and based on a difference between the output and the expected output the parameters of the network are varied such that the difference between the output of the network and the expected output is reduced. This process is then repeated for a plurality of training inputs to train the network. The difference between the output of the network and the expected output may be defined by a loss function. The result of the loss function may be calculated using the difference between the output of the network and the expected output to determine the gradient of the loss function. Back-propagation of the gradient descent of the loss function may be used to update the parameters of the neural network using the gradients dL/dy of the loss function. A plurality of neural networks in a system may be trained simultaneously through back-propagation of the gradient of the loss function to each network.

In the case of AI based image or video compression, the loss function may be defined by the rate distortion equation. The rate distortion equation may be represented by $Loss=D+\lambda*R$, where D is the distortion function, A is a weighting factor, and R is the rate loss. λ may be referred to as a lagrange multiplier. The langrange multiplier provides as weight for a particular term of the loss function in relation to each other term and can be used to control which terms of the loss function are favoured when training the network.

In the case of AI based image or video compression, a training set of input images may as be used. An example training set of input images is the KODAK image set (for example at www.cs.albany.edu/xypan/research/snr/Kodak.html). An example training set of input images is the IMAX image set. An example training set of input images is the Imagenet dataset (for example at www.image-net.org/download). An example training set of input images is the CLIC Training Dataset P ("professional") and M ("mobile") (for example at challenge.compression.cc/tasks/).

An example of an AI based compression process 100 is shown in FIG. 1. As a first step in the AI based compression process, an input image 5 is provided. The input image 5 is provided to a trained neural network 110 characterized by a function $f_\theta$ acting as an encoder. The encoder neural network 110 produces an output based on the input image. This output is referred to as a latent representation of the input image 5. In a second step, the latent representation is quantised in a quantisation process 140 characterised by the operation Q, resulting in a quantized latent. The quantisation process transforms the continuous latent representation into a discrete quantized latent. An example of a quantization process is a rounding function.

In a third step, the quantized latent is entropy encoded in an entropy encoding process 150 to produce a bitstream 130. The entropy encoding process may be for example, range or arithmetic encoding. In a fourth step, the bitstream 130 may be transmitted across a communication network.

In a fifth step, the bitstream is entropy decoded in an entropy decoding process 160. The quantized latent is provided to another trained neural network 120 characterized by a function $g_\theta$ acting as a decoder, which decodes the quantized latent. The trained neural network 120 produces an output based on the quantized latent. The output may be the output image of the AI based compression process 100. The encoder-decoder system may be referred to as an autoencoder.

The system described above may be distributed across multiple locations and/or devices. For example, the encoder 110 may be located on a device such as a laptop computer, desktop computer, smart phone or server. The decoder 120 may be located on a separate device which may be referred to as a recipient device. The system used to encode, transmit and decode the input image 5 to obtain the output image 6 may be referred to as a compression pipeline.

The AI based compression process may further comprise a hyper-network 105 for the transmission of meta-information that improves the compression process. The hyper-network 105 comprises a trained neural network 115 acting as a hyper-encoder $$f_\theta^h$$

and a trained neural network 125 acting as a hyper-decoder $$g_\theta^h.$$

Figure 2:
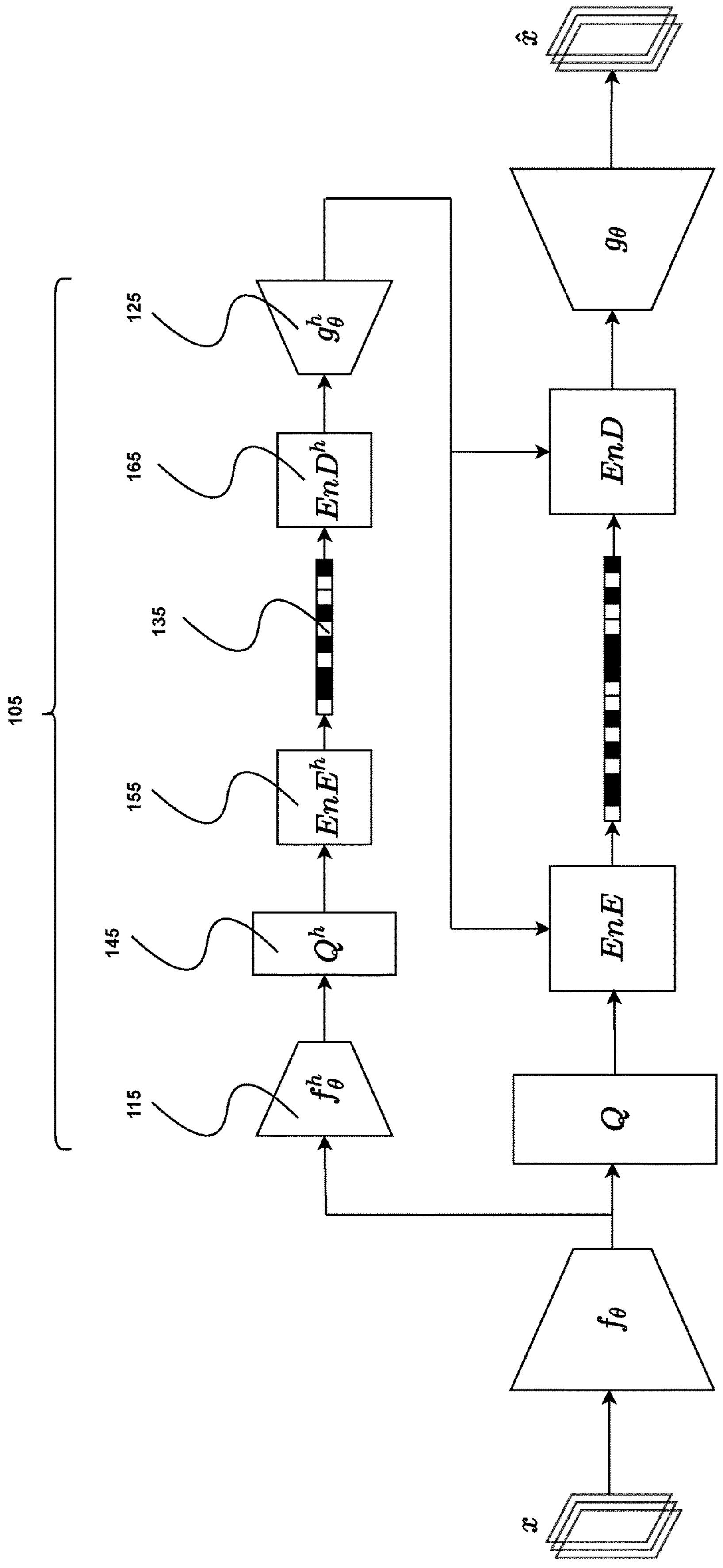
FIG. 2 illustrates a further example of an image or video compression, transmission and decompression pipeline including a hyper-network.

An example of such a system is shown in FIG. 2.

Components of the system not further discussed may be assumed to be the same as discussed above. The neural network 115 acting as a hyper-decoder receives the latent that is the output of the encoder 110. The hyper-encoder 115 produces an output based on the latent representation that may be referred to as a hyper-latent representation. The hyper-latent is then quantized in a quantization process 145 characterised by $Q^h$ to produce a quantized hyper-latent. The quantization process 145 characterised by $Q^h$ may be the same as the quantisation process 140 characterised by Q discussed above.

In a similar manner as discussed above for the quantized latent, the quantized hyper-latent is then entropy encoded in an entropy encoding process 155 to produce a bitstream 135. The bitstream 135 may be entropy decoded in an entropy decoding process 165 to retrieve the quantized hyper-latent. The quantized hyper-latent is then used as an input to trained neural network 125 acting as a hyper-decoder. However, in contrast to the compression pipeline 100, the output of the hyper-decoder may not be an approximation of the input to the hyper-decoder 115. Instead, the output of the hyper-decoder is used to provide parameters for use in the entropy encoding process 150 and entropy decoding process 160 in the main compression process 100. For example, the output of the hyper-decoder 125 can include one or more of the mean, standard deviation, variance or any other parameter used to describe a probability model for the entropy encoding process 150 and entropy decoding process 160 of the latent representation. In the example shown in FIG. 2, only a single entropy decoding process 165 and hyper-decoder 125 is shown for simplicity. However, in practice, as the decompression process usually takes place on a separate device, duplicates of these processes will be present on the device used for encoding to provide the parameters to be used in the entropy encoding process 150.

Further transformations may be applied to at least one of the latent and the hyper-latent at any stage in the AI based compression process 100. For example, at least one of the latent and the hyper latent may be converted to a residual value before the entropy encoding process 150,155 is performed. The residual value may be determined by subtracting the mean value of the distribution of latents or hyper-latents from each latent or hyper latent. The residual values may also be normalised.

To perform training of the AI based compression process described above, a training set of input images may be used as described above. During the training process, the parameters of both the encoder 110 and the decoder 120 may be simultaneously updated in each training step. If a hyper-network 105 is also present, the parameters of both the hyper-encoder 115 and the hyper-decoder 125 may additionally be simultaneously updated in each training step The training process may further include a generative adversarial network (GAN). When applied to an AI based compression process, in addition to the compression pipeline described above, an additional neutral network acting as a discriminator is included in the system. The discriminator receives an input and outputs a score based on the input providing an indication of whether the discriminator considers the input to be ground truth or fake. For example, the indicator may be a score, with a high score associated with a ground truth input and a low score associated with a fake input. For training of a discriminator, a loss function is used that maximizes the difference in the output indication between an input ground truth and input fake.

When a GAN is incorporated into the training of the compression process, the output image 6 may be provided to the discriminator. The output of the discriminator may then be used in the loss function of the compression process as a measure of the distortion of the compression process. Alternatively, the discriminator may receive both the input image 5 and the output image 6 and the difference in output indication may then be used in the loss function of the compression process as a measure of the distortion of the compression process. Training of the neural network acting as a discriminator and the other neutral networks in the compression process may be performed simultaneously. During use of the trained compression pipeline for the compression and transmission of images or video, the discriminator neural network is removed from the system and the output of the compression pipeline is the output image 6.

Incorporation of a GAN into the training process may cause the decoder 120 to perform hallucination. Hallucination is the process of adding information in the output image 6 that was not present in the input image 5. In an example, hallucination may add fine detail to the output image 6 that was not present in the input image 5 or received by the decoder 120. The hallucination performed may be based on information in the quantized latent received by decoder 120.

As discussed above, a video is made up of a series of images arranged in sequential order. AI based compression process 100 described above may be applied multiple times to perform compression, transmission and decompression of a video. For example, each frame of the video may be compressed, transmitted and decompressed individually. The received frames may then be grouped to obtain the original video.

A number of concepts related to the AI compression processes discussed above will now be described. Although each concept is described separately, one or more of the concepts described below may be applied in an AI based compression process as described above.

Second Moment Penalty

In neural (AI-based) compression, a mathematical model (the "network") is commonly comprised by a set of tensors ("neurons"), which apply a mathematical transformation to the input data (e.g. images/video) and return an output as discussed above. Groups of neurons within the network may be organized in sequential "layers" with the property that output tensors of a particular layer are passed on as the inputs to the next layer. The number of layers in the network may be referred to as the "depth" of the network. Denoting the input data by x, the transformation in a layer (that is a combined transformation of all the neurons) is most commonly comprised of an affine linear transformation followed by a non-linear function σ ("activation function"):

$$y=Ax+b$$

$$z=\sigma(y). \tag{1}$$

The transformed tensors y and z may be referred to as the "pre-activation feature map" and "feature map" respectively. The tensors A and b are examples "parameters" associated to a single layer (there could be additional parameters); their values are specific to the network and can be altered or "tuned". The transformed tensors y and z are therefore outputs of their respective transformations.

The "learning" of the network is done by propagating data (e.g. images/video) sequentially through the network whilst incrementally tuning the parameters according to some differentiable loss measure we denote by L (the "loss function") as discussed above. The process of data propagation in order to tune parameters is commonly referred to as "training". This is contrasted by "inference", which refers exclusively to the propagation of data (that usually has not been used for the training process) through the network, without tuning the parameters. The loss associated with inference passes ("validation loss") is a direct measure of the network's general performance level for the task to which it has been assigned to adapt.

AI-based image and video compression commonly employs networks with a large number of layers ("deep networks"). To increase the training speed, find good minima of the training loss, and ensure good gradient propagation, deep networks may need adjustments of the layer inputs to ensure that the input distribution does vary during training. These are especially pertinent in contexts when the loss function requires two networks to be trained in simultaneously ("adversarial training"). The requisite adjustments are often achieved using so-called "normalization layers", which explicitly adjust the inputs (most commonly their mean and variance) to pre-specified targets. For example, in the batch normalization scheme, the input in the training step consists of a collection of the training samples ("(mini)-batch").

The elements of every batch are then transformed so that the batch mean is equal to zero and batch mean and standard deviation is equal to 1. The normalization transformation is $$\hat{x}_b = \frac{x_b - \mu_B}{\sqrt{(\sigma_B^2 + \epsilon)}}, \tag{2}$$

where $\beta_B$ and $\sigma_B$ are the batch mean and standard deviation and the constant $\epsilon$ is added for numerical stability. This ensures that distribution of normalized inputs $\hat{x}$ over the entire dataset has the expected mean of 0 and expected standard deviation of 1. Additionally, the normalization transform may be followed up by an affine linear map so that the network can learn to undo the normalization if necessary. Other normalization layers (channel normalization, layer normalization) differ in the dimension over which the mean and standard deviation are aggregated. However, batch normalisation can lead to large runtime costs.

An example of an alternative approach referred to as a second moment penalty (SMP) will now be discussed. In contrast to the aforementioned normalization approaches the second moment penalty may vary the loss function based on at least one of the pre-activation feature maps in the network. In an example, the additional term may be based on the mean of the element-wise squares of at least one of the pre-activation feature maps in the network. The additional term may be based on the pre-activation feature maps of every later in the network. The size of the additional term may be controlled by a positive real number $\lambda_{SMP}$.

In an example with all of these features, the SMP loss function may be defined as $$L_{SMP} = L_{no\,SMP} + \lambda_{SMP}\sum_i \overline{y_i^2}, \tag{3}$$

where the index i enumerates all the layers in the network. The second moment penalty penalizes the size of the elements in the feature maps, and therefore may prevent them from growing too large during training. Moreover, the penalty may drive the empirical distribution of every element in the feature map towards that of a normal (Gaussian) random variable with mean 0, and variance determined by the number of elements in the feature map and $\lambda_{SMP}$. The second moment penalty therefore may normalize the feature maps across the training dataset. Similarly to batch normalization described above, SMP may result in the distribution of the pre-activation feature map to have zero mean and a fixed variance.

Another benefit of SMP is that it may control the variance of the feature maps throughout training. In training deep neural networks one frequently encounters the problem of either exploding or vanishing variance of the feature maps or the parameter gradients. A common way of remedying this in the deep learning community is by choosing an weight (parameter) initialization heuristic that has favorable properties. However, parameters are initialized before training and the influence of the choice of initialization diminishes over time. Second moment penalty may provide control over the feature weight variance over the entire training and thus gives a more robust solution to the problem of exploding or vanishing variances.

Alternative modifications to the loss that may be applied include:

The average of absolute values $\lambda_{SMP}\Sigma_i\overline{|y_i|}$. This corresponds to imposing a mean zero Laplacian prior and encourages sparsity in the feature maps.

Elastic-net type penalty $$\lambda_{SMP}\sum_{1} \cdot \alpha_1 \overline{y_1^2} + \beta_i \overline{|y_i|},$$

where $\alpha_i$ and $\beta_i$ are positive real numbers that are set in advance. This corresponds to hierarchical elastic-net prior.

Other positive functions of elements in the feature maps with properties analogous to the above.

In addition to the additional term in the loss function an additional affine linear transformation may be added to every layer of the network. This allows the network to adjust to the penalty or bypass it entirely if that is optimal. The transformations in a single layer are now of the form (cf. (1))

$$y=Ax+b$$

$$w=\lambda_{SMP}y+b_{SMP}$$

$$z=\sigma(w). \quad (4)$$

The additional transformation may take place after the pre-activation feature map y has been captured and the two tensors, $\lambda_{SMP}$ and $b_{SMP}$, may be additional tunable parameters in a given layer. The two successive linear maps can be fused in a single non-linear operation and therefore the runtime remains unaffected. Other possible transformations of the pre-activation feature map include (but are not limited to):

single convolutional layer, dense layer, separate deep neural network for each layer, depth-wise convolutions.

The distribution targeting property of the SMP and its variants may arise from the fact that the additional term in the SMP loss function (3) is the negative log likelihood a mean-zero isotropic Gaussian distribution. To explain this in more detail we consider a single element of the pre-activation feature map in layer i. A single element is specified by four coordinates: batch, channel, height, and width and we hence denote the element by $y_i(b, c, h, w)$. The contribution of this element to the overall loss function is $$\text{loss contibution of } y_i(b, c, h, w) = \frac{\lambda_{SMP}}{N} y_i(b, c, h, w)^2. \quad (5)$$

The positive integer N is an artefact of taking the mean across the pre-activation feature map and is equal to the number of elements in the i-th feature map. The $y_i(b, c, h, w)^2$ can be viewed as the negative log likelihood of the standard normal random variable with mean 0 and standard deviation of 1. The overall factor $$\frac{\lambda_{SMP}}{N}$$

rescales the standard deviation to $$\frac{\lambda_{SMP}}{N}.$$

Since N and $\lambda_{SMP}$ are constants this distribution is the same for every element in $y_i$. The samples of a fixed element $y_i(b, c, h, w)$ over the training dataset are independent and identically distributed so the network learns a normalizing transform that pushes the distribution over the training dataset of $y_i(b, c, h, w)$ to be the normal distribution with the aforementioned parameters.

Extending the second moment penalty to alter the target distribution may amount to replacing the loss contribution with the negative log likelihood of the desired target distribution. For example, the corresponding loss contribution for Laplace distribution with location 0 and scale $$\frac{\lambda_{SMP}}{N}$$

is $$\text{loss contribution of } y_i(b, c, h, w) = \frac{\lambda_{SMP}}{N} |y_i(b, c, h, w)|. \quad (6)$$

The scope of approach is not limited to probability distribution with analytically tractable likelihoods. Since only sampling from the distribution is required, more complicated distributions can be used by leveraging a sampling algorithm such as Markov Chain Monte Carlo.

In addition to the arrangements listed above, the second moment penalty can be extended in ways including, but not limited to:

In addition to targeting a mean of 0 a variance to be equal to 1 can be targeted.

The penalty terms described above target the first and second moments of the probability distribution of the pre-activation feature maps. Different penalty terms that target other combinations of moments can be implemented.

Every layer in the network can be endowed with its own hyper-parameter $\lambda_{SMP}$ thereby enabling a granular control over the normalization strength on a per layer basis.

The hyper-parameter(s) $\lambda_{SMP}$ can vary during training and be subject to annealing schedule that controls its size at various stages of training.

Any combination of the above.

Figure 3:
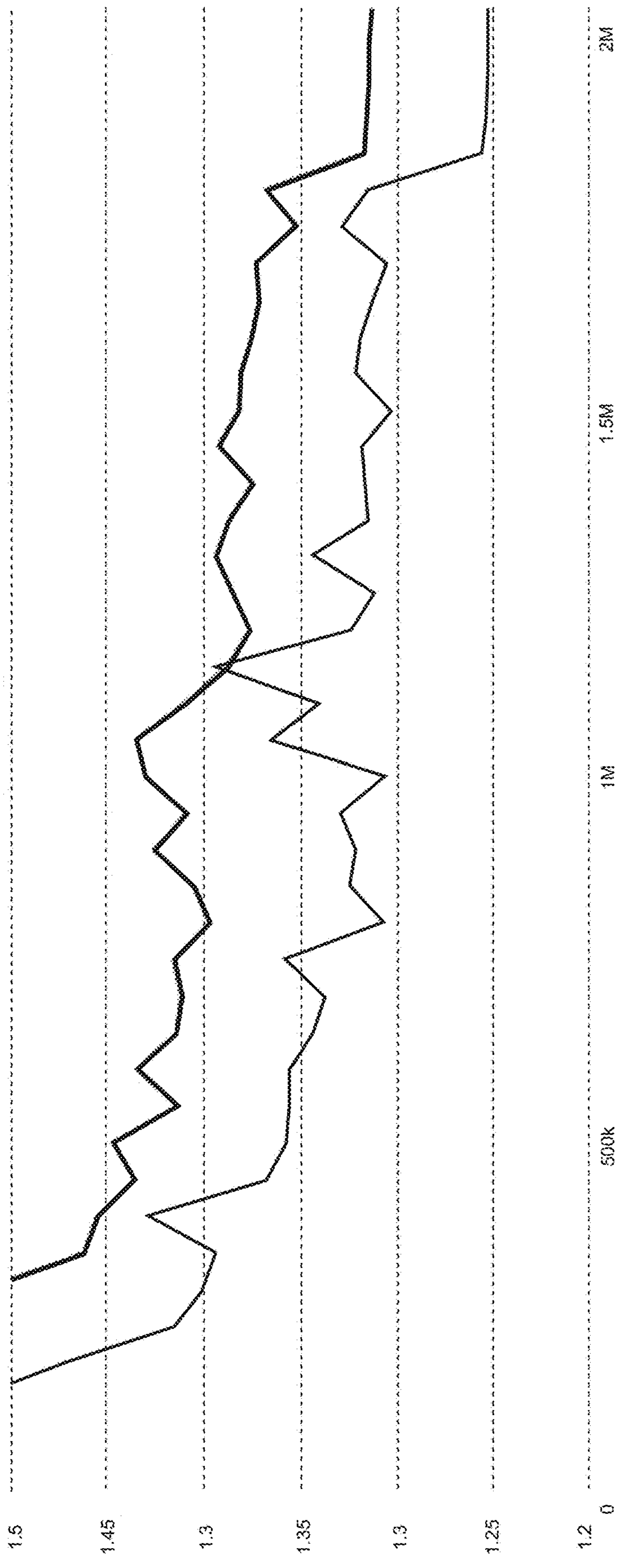
FIG. 3 illustrates a loss curve for a AI compression system trained with and without the use of the use of second moment penalty.

FIG. 3 shows a loss curve for a AI compression system trained with and without the use of the use of second moment penalty as described above. The x-axis shows training iterations and the y-axis shows the loss of the system. The AI compression system comprised a system with a seven layer encoder and a six layer decoder. The upper line in the figure corresponds to the system trained without SMP, and the bottom layer corresponds to the same system trained with SMP. It can be seen that the loss of the system improves by 5%. The bits per pixel and MSE improved by 6% and 3% respectively when SMP was used.

The second moment penalty and any variants or extensions thereof can be used in any neural network layer architecture including, but not limited to, dense layers, residual blocks, attention layers, long short-term memory layers. As such it can be used in a wide variety of neural network models including, but not limited to densely connected neural networks, convolutional neural networks, generative adversarial networks, transformers, residual networks.

A Context

In AI-based compression, latent variables y are typically quantized to the variable ĵ via the following equation $$\hat{y}=\text{round}(y-\mu)+\mu \quad (7)$$

Here μ is a location parameter, which could be predicted, for example by (in AI-based compression) a hypernetwork as discussed above. The rounding function round(•) maps real-valued input to the nearest integer. The quantized latents are then encoded into a bitstream, typically with a fully factorized model, where each pixel has mean y and scale-parameter σ. Note that the closer the rounded residual round(y−μ) is to zero, the smaller the bitstream, which is advantageous for compression rates. Thus, the closer the location prediction μ is y, the better the compression rate.

An extension of this approach is to quantize via a non-linear implicit equation $$\hat{y}=\text{round}(y-\mu+A\hat{y})+\mu-A\hat{y} \quad (8)$$

If the latents lie in a d dimensional space, here A is a d×d matrix. The quantized latent variable ŷ appears here on both sides of the equation, and must be solved for. The idea of this quantization scheme is that neighbouring quantized pixels may contain relevant information about a given pixel, and so can be employed to make better location predictions. In other words, we can view μ−Aŷ as a 'boosted' location prediction, which can further reduce the compression rate of the quantized latent.

The matrix A can be fixed (possibly learned beforehand); or predicted in someway, such as by a hypernetwork, or somehow derived on a per-image basis.

Unfortunately, solving (8) is in general, extremely difficult. In the very special case when A is a strictly lower (or upper) triangular matrix with respect to some permutation of the latents, then (8) can be easily solved via nonlinear forward substitution (or back substitution). In all other cases, it is not all obvious how (8) can be solved.

Several methods for solving the encode problem arising from (8) will now be discussed. The inverse problem in decoding, which involves solving a linear system, will also be discussed.

A method for solving the encode problem (8) is to use fixed point iteration. That is, given an initial guess $\hat{y}^0$, iterate $$\hat{y}^{k+1}=\text{round}(y-\mu+A\hat{y}^k)+\mu-A\hat{y}^k \quad (9)$$

until convergence.

When A is symmetric positive definite with spectral norm less than one does this method converge. This is undesirable, for it puts overly restrictive constraints on the structure of A.

As an alternative, a significant number of algorithms for solving (8) arise by introducing the auxiliary variable ξ=y−μ+Aŷ. The variable ξ may be called the residual. We will slightly rewrite this system, so that the unknown variables are on the left-hand-side.

$$\text{round}(\xi)-(I+A)\hat{y}=-\mu$$

$$\xi-A\hat{y}=y-\mu \quad (10)$$

This is a nonlinear saddle-point problem. Examples of linear saddle-point problems and their algorithms are provided in Michele Benzi, Gene H. Golub, and Jörg Liesen. Numerical solution of saddle point problems. Acta Numerica, 14:1-137, May 2005, which is hereby incorporated by reference.

This problem falls in the general class of nonlinear saddle-point problems of the form $$F(x)+B_1^T z=a \quad (11)$$

$$B_2 x-C_z=b.$$

If F is maximally monotone (to be discussed in the following paragraph), and C is symmetric and positive semidefinite, existence of a solution is guaranteed. (This can even be relaxed to requiring $C+C^T$ positive semidefinite.) We will call saddle-point problems written in this way (with these properties) a saddle-point problem in standard form.

A set-valued function T(•) is monotone when (u−v,x−y)≥0 for every u∈T(x) and v∈T(y). A set valued function T(x) is maximally monotone if there are no other monotone operators B for which the graph of T is properly contained in B.

Note that round(ξ) is monotone (but not maximally monotone). This is a problem: existence and uniqueness results of non-linear saddlepoint problems can only be guaranteed when the operators are maximally monotone.

Therefore, the rounding function may be extended by defining the maximally monotone extension round(•) via the set-valued function $$\lfloor x\rceil=\begin{cases}\text{round }(x) \text{ if } x\notin\mathbb{Z}+\frac{1}{2}\\ [\text{floor}(x), \text{ceil}(x)] \text{ otherwise}\end{cases} \quad (12)$$

Here $\mathbb{Z}+\frac{1}{2}$ is the set of integers plus one half, and floor(x) and ceil(x) are the functions that respectively return the largest integer below x, and the smallest integer above x. In what follows, we will conflate the maximal monotone function ⌊•⌉ with round(•) unless otherwise specifically said.

For a generic real-valued A, (10) is not in standard form. This is because in general, A could have both eigenvalues with positive and negative real-parts, in which case A is not positive definite. If A is positive definite, we may identify C=A in (11), and set $$B_1^T=-(I+A), B_2=I, F=\text{round}(\cdot),$$

and identify x=ξ and z=ŷ. Clearly a=−μ and b=y−μ.

(10) may be re-written in standard form as follows. Suppose A has an eigendecomposition $A=Q\Lambda Q^{-1}$. (Other decompositions may be used, such as the Schur decomposition.) Multiply the linear equation by $Q^{-1}$ and identify $\tilde{z}=Q^{-1}\hat{y}$. Equation (10) becomes $$\text{round}(\xi)-Q(I+\Lambda)\tilde{z}=-\mu$$

$$Q^{-1}\xi-\Lambda\tilde{z}=Q^{-1}(y-\mu) \quad (13)$$

Assume the spectral decomposition has ordered the eigenvalues from smallest to largest real values in ascending order $$\Lambda=\begin{pmatrix}\Lambda_{<0} & 0\\ 0 & \Lambda_{\geq 0}\end{pmatrix} \quad (14)$$

The diagonal Λ contains eigenvalues with both positive and negative real-part. Identify C with the submatrix $\Lambda_{\geq 0}$ containing eigenvalues with positive real-part.

Similarly define z as corresponding to the sub-vector of $\tilde{z}$ who's eigenvalues in A have positive real-part $B_1$ and $B_2$ can similarly be obtained by taking sub-matrices of $Q(I+\Lambda)$ and $Q^{-1}$ which correspond to the to the sub-vector of $\tilde{z}$ who's eigenvalues in A have positive real-part Define x as the concatentation of ξ, and the remaining elements of $\tilde{z}$ (those elements who's eigenvalues in A have negative real-part)

F is then defined as the function rounding ξ, plus all the remaining linear terms not otherwise accounted for.

a and b are set to the appropriate components of the right-hand-side

Once the system has been transformed into standard form, several algorithms are available for solving the system. An example is an algorithm that relies on the heuristic of alternating updates in x and z. This is an example of an iterative methods that use an operator splitting. For example, the problem can be split into two or more sets of variables, and updates are performed on each subset of variables, in an iterative fashion.

Saddle-point problems can roughly be thought of as arising from a minimax optimization problem, where some scalar function is to be minimized in x and maximized in z. Thus saddle-point algorithms may be thought of as alternating a "descent step in x" and an "ascent step in z", where these steps are respectively decreasing/increasing the value of the scalar function.

The iterative updates may take the following form. Initial iterates $x^0$ and $z^0$ are set. Then, the following updates are performed until a convergence criteria is met:

$$\text{Set } x^{k+1} \text{ the solution of } x^{k+1} = x^k - \tau\left(F\left(x^{\dagger}\right) + B_1^T z^k - a\right).$$

$$\text{Set } z^{k+1} \text{ the solution of } z^{k+1} = z^k + \sigma\left(B_2 x^{k+1} - C z^{\dagger} - b\right)$$

Here τ and σ are step-size parameters. The size of these step-sizes parameters may be chosen appropriately to ensure convergence, and may depend on the cocoercivity (Lipschitz constant) of F(•) and C respectively. For instance, the step size may be chosen to be less than or equal to one-half the reciprocal of the Lipschitz constant (cocoercivity modulus) of the operator.

Here $x^{\dagger}$ is either $x^k$ or $x^{k+1}$, and $z^{\dagger}$ similarly is either $z^k$ or $z^{k+1}$. The choice of whether to use the current iterate (superscript k), or the updated iterate (superscript k+1) determines whether each of these update rules is explicit or implicit. If the current iterate is used, the update is explicit. If the updated iterate is used, the system is implicit. Note that implicit and explicit updates may both be performed: for example we may do an implicit update in x and an explicit update in z.

Explicit updates are computationally simple and straightforward to implement. These can be thought of as corresponding to an explicit Euler step (if we were to think of the system as discretizing an ordinary differential equation). An alternative name for an explicit update step is a forward step or forward update-rule.

However, despite being simple, explicit update rules may not lead to convergence. This is especially true when F has a large (or infinite) Lipschitz constant, such as when F is the rounding function. Therefore, implicit update rules may instead be used.

Implicit updates involve the iterations $$\text{Set } x^{k+1} \text{ the solution of } x^{k+1} = x^k - \tau\left(F\left(x^{k+1}\right) + B_1^T z^k - a\right).$$

$$\text{Set } z^{k+1} \text{ the solution of } z^{k+1} = z^k + \sigma\left(B_2 x^{k+1} - C z^{k+1} - b\right)$$

The first (implicit) update rule can be rearranged $$x^{k+1} + \tau F\left(x^{k+1}\right) = x^k - \tau\left(B_1^T z^k - a\right) \tag{15}$$

where $x^{k+1}$ is the unknown variable we must solve for. The solution operator to this type of system has a special name: it is called the resolvent. Given an input y and step size α the resolvent of an operator F may be written $$R_F^{\alpha}(y)$$

and is the solution x solving $x+\alpha F(x)=y$. Therefore, in this notation, the update rule here can be written $$x^{k+1} = R_F^{\tau}\left(x^k - \tau\left(B_1^T z^k - a\right)\right).$$

The second update rule, when implicit, can be rearranged $$(I+\sigma C)z^{k+1} = z^k + \sigma(B_2 x^{k+1} - b) \tag{16}$$

In other words, in resolvent notation, $$z^{k+1} = R_C^{\sigma}\left(z^k + \sigma\left(B_2 x^{k+1} - b\right)\right).$$

Since C is linear, this amounts to inverting the matrix $I+\sigma C$.

The operator F may comprise the maximally monotone rounding function $\lfloor \bullet \rceil$. It can be shown that $$R_{\lfloor\rceil}^{\alpha}(x)$$

can be determined via the following algorithm.

$$\text{Set } \tilde{u} = \frac{x}{1+\alpha}.$$

Then, perform the following checks:

1. Set $u_* = \lfloor(\rfloor\tilde{u})$. If $$(1+\alpha)u_* + r - x = 0,\ 0 \leq r < \frac{1}{2}$$

is feasible in r, return $u = u_* + r$

2. Else, set $u^* = \lceil ( \rceil \tilde{u})$. If $$(1+\alpha)u^* - r - x = 0,\ 0 \le r < \frac{1}{2}$$

is feasible in r, return $u = u^* - r$

3. Else return $$u = u_* + \frac{1}{2}.$$

If x is a vector, the algorithm is applied point-wise to the elements of x.

We briefly note that $\lfloor x \rceil$ is the subdifferential of the function $$\Phi(x) = \langle \lfloor x \rceil, x - \frac{1}{2}\lfloor x \rceil \rangle,$$

which is a piecewise linear approximation of the quadratic function $\frac{1}{2}\|x\|^2$. The pieces here are linear on unit squares of the integer lattice.

Further splittings of the operator can be applied. For instance, if $z=[z_<, z_\geq]$ is defined arising from converting (10) into standard form (11), then we can further split the update steps into first updating x, then $z_<$, and then $z_\geq$ (or any other ordering of these variables). Any of these further splittings could have their updates be either implicit or explicit. The problem can be further subdivided into other splittings of the system, so that updates can be applied in any order on the splitting variables.

Furthermore, accelerated update rules may be performed. For instance, we could set $z^{k+1} \leftarrow z^{k+1} + \theta(z^{k+1} - z^k)$, where θ is an acceleration parameter. Similarly we could set $x^{k+1} \leftarrow x^{k+1} + \theta(x^{k+1} - x^k)$. These assignments could be performed after each set of iterations. They can have the effect of accelerating convergence of the algorithm.

When A is negative definite, the problem is no longer a saddle-point problem. This is because there are now no directions along which the system (10) is contractive in ŷ. If (10) is maximally monotone in both ξ and ŷ, then the system can be viewed as the problem of finding zeros of a maximally monotone operator. Rather than doing "descent step in x", then "ascent step in z", we instead do two descent steps in the splitting variables. In other words, the algorithms of the previous sections may all apply, except replace "+σ" with "−σ". The resolvant of the linear term would then be $$R^{\sigma}_{-C}(\cdot).$$

Certain extra conditions may be needed on $$B_1^T$$

and $B_2$ to ensure the system is monotone. Moreover, if the system is not monotone, then extra steps may be needed to ensure stability of the iterative algorithm.

If A is singular, it simply means the solution to the problem is not unique. In this case, an extra term such as ⊕ŷ may be added to the system. This will simply make the algorithm choose one unique solution of the many possible solutions.

The decoding process will now be discussed. Supposing ξ and $\hat{y}_{encode}$ have been found by one of the algorithms presented above, the variable ξ is then quantized via $\hat{\xi}$=round(ξ), and encoded and sent in the bitstream. Then, on decode, $\hat{\xi}$ is recovered from the bistream. $\hat{y}_{decode}$ is recovered by solving $$(I+A)\hat{y}_{decode} = \mu + \hat{\xi} \tag{17}$$

The error between $\hat{y}_{encode}$, the latent representation, and the decoded $\hat{y}_{decode}$ which corresponds to the latent representation but may not be identical, depends on

- The condition number of I+A
- The number of elements of ξ which have half-integer values. The error introduced here arises from the fact that we use the maximal monotone extension $\lfloor \bullet \rceil$ of round(•). When the maximal monotone function outputs a set (when 4 is a half-integer), this differs from the naive round function by up to an absolute value of 1. This can lead to some errors between encode and decode, which can be ameliorated by also conditioning I+A properly.

L Context and Learned Bins

As discussed above, a compression algorithm may be broken into two phases: the encoding phase and the decoding phase. In the encoding phase, input data is transformed into a latent variable with a smaller representation (in bits) than the original input variable. In the decode phase, a reverse transform is applied to the latent variable, in which the original data (or an approximation of the original data) is recovered.

An AI-based compression system must be also be trained. This is the procedure of choosing parameters of the AI-based compression system that achieve good compression results (small file size and minimal distortion). During training, parts of the encoding and decoding algorithm are run, in order to decide how to adjust the parameters of the AI-based compression system.

To be precise, in AI-based compression, encoding typically takes the following form:

$$y = f_{enc}(x, \theta) \tag{18a}$$

$$\hat{y} = Q(y) \tag{18b}$$

$$\text{bitstream} = AE(\hat{y}, p(\hat{y})) \tag{18c}$$

Here x is the data to be compressed (image or video), $f_{enc}$ is the encoder, which is usually a neural network with parameters θ that are trained. The encoder transforms the input data x into a latent representation y, which is lower-dimensional and in an improved form for further compression.

To compress y further and transmit as a stream of bits, an established lossless encoding algorithm such as arithmetic encoding is used. These lossless encoding algorithms require y to be discrete, not continuous, and also require knowledge of the probability distribution of the latent representation. To achieve this, a quantisation function Q (usually nearest integer rounding) is used to convert the continuous data into discrete values ŷ.

The necessary probability distribution p(9) is found by fitting a probability distribution onto the latent space. The probability distribution can be directly learned, or as often is the case, is a parameteric distribution with parameters determined by a hyper-network consisting of a hyper-encoder and hyper-decoder. If using a hyper-network as discussed above, an additional bitstream 2 (also known as "side information") may be encoded, transmitted, and decoded:

$$z=g_{enc}(y,\phi) \tag{19a}$$

$$\hat{z}=Q(z) \tag{19b}$$

$$\text{bitstream}=AE(\hat{z},p(\hat{z})) \tag{19c}$$

$$\hat{z}=AD(\text{bitstream},p(\hat{z})) \tag{19d}$$

$$\mu_y,\sigma_y=g_{dec}(\hat{z},\phi) \tag{19e}$$

where $\mu_y$, $\sigma_y$ are the mean and scale parameters that determine the quantised latent distribution $p(\hat{y})$.

Decoding proceeds as follows:

$$\hat{y}=AD(\text{bitstream},p(\hat{y})) \tag{20a}$$

$$\hat{x}=f_{dec}(\hat{y},\theta) \tag{20b}$$

Summarising: the distribution of latents $p(\hat{y})$ is used in the arithmetic decoder (or other lossless decoding algorithm) to turn the bitstream into the quantised latents $\hat{y}$. Then a function $f_{dec}$ transforms the quantised latents into a lossy reconstruction of the input data, denoted $\hat{x}$. In AI-based compression, $f_{dec}$ is usually a neural network, depending on learned parameters $\theta$.

If using a hyper-network, the side information bitstream is first decoded and then used to obtain the parameters needed to construct $p(\hat{y})$, which is needed for decoding the main bitstream.

A significant step in the typical AI-based image and video compression pipeline is "quantisation," where the pixels of the latent representation are usually rounded to the nearest integer. This is required for the algorithms that losslessly encode the bitstream. However, the quantisation step introduces its own information loss, which impacts reconstruction quality.

The quantisation function can be improved by training a neural network to predict the size of the quantisation bin that should be used for each latent pixel. Normally, the latents y are rounded to the nearest integer, which corresponds to a "bin size" of 1. That is, every possible value of y in an interval of length 1 gets mapped to the same $\hat{y}$:

$$y \in [\text{round}(y)-1/2,\ \text{round}(y)+1/2) \overset{Q}{\mapsto} \hat{y} \tag{21}$$

However, this is not the optimal choice of information loss: for some latent pixels, more information can be disregarded (equivalently: using bins larger than 1) without impacting reconstruction quality much. And for other latent pixels, the optimal bin size is smaller than 1.

Learned quantisation resolves the above issue, by predicting the quantisation bin size, per image, per pixel. This may be done with a tensor $\Delta \in \mathbb{R}^C \times \mathbb{R}^H \times \mathbb{R}^W$, which then modifies the quantisation function as follows:

$$\hat{\xi}_y = Q_\Delta(y) = \text{round}\left(\frac{y}{\Delta}\right) \tag{22}$$

We refer to $\hat{\xi}_y$ as the "quantised latent residuals." Thus Equation 21 becomes:

$$y \in [\text{round}(y)-\Delta/2,\ \text{round}(y)+\Delta/2) \overset{Q}{\mapsto} \hat{\xi}_y \tag{23}$$

indicating that values in an interval of length $\Delta$ get mapped to the same quantised latent value.

Note that because the learned quantisation bin sizes are incorporated into a modification of the quantisation function Q, any data that we wish to encode and transmit can make use of learned quantisation bin sizes. For example, if instead of encoding the latents y, we wish to encode the mean-subtracted latents $y-\mu_y$, this can be achieved:

$$\hat{\xi}_y = Q_\Delta(y-\mu_y) = \text{round}\left(\frac{y-\mu_y}{\Delta}\right) \tag{24}$$

Similarly, hyperlatents, hyperhyperlatents, and other objects we might wish to quantise can all use the modified quantisation function $Q_\Delta$, for an appropriately learned $\Delta$.

We detail several architectures for predicting quantisation bin sizes. An example architecture is predicting the quantisation bin sizes $\Delta$ using a hypernetwork. The bitstream is encoded as follows:

$$\hat{\xi}_y = Q_\Delta(y) = \text{round}\left(\frac{y}{\Delta}\right) \tag{25a}$$

$$\text{bitstream} = AE(\hat{\xi}_y) \tag{25b}$$

where the division is element-wise. $\hat{\xi}_y$ is now the object that is losslessly encoded and sent as a bitstream (we refer to $\hat{\xi}_y$ as the quantised latent residuals).

When decoding, the bitstream is losslessly decoded as usual. We then use $\Delta$ to rescale $\xi_y$ by multiplying the two element-wise. The result of this transformation is what is now denoted $\hat{y}$ and passed to the decoder network as usual:

$$\hat{\xi}_y=AD(\text{bitstream}) \tag{26a}$$

$$\hat{y}=\Delta \odot \hat{\xi}_y \tag{26b}$$

$$\hat{x}=f_{dec}(\hat{y},\theta) \tag{26c}$$

We detail several variants of the above architectures which are of use:

Quantisation bins sizes for the hyperlatents can be learned parameters, or we can include a hyperhyper-network that predicts these variables.

After obtaining the quantisation bin sizes $\Delta_y$ from the hyper decoder, this tensor can be processed further by an additional nonlinear function. This nonlinear function would in general be a neural network (but is not limited to this choice).

We also emphasise that our methods for learning quantisation bins are compatible with all ways of transmitting metainformation, such as hyperpriors, hyperhyperpriors, autoregressive models, and implicit models.

In AI-based compression, it is advantageous to transform the latent variables prior to quantisation using a "context model." The context model increases performance by transforming each pixels by a function of neighboring pixels, thus encoding contextual information. On decoding, the transformation is reversed.

Many types of context models are computationally expensive, rendering them challenging or even impossible to use in AI-based compression intended for end user devices. However, if the context model is a linear function of neighboring pixels and defined through an implicit equation, context modelling is feasible from a runtime perspective due to the existence of fast implicit equation solving algorithms. An example of such an implicit equation is to augment the mean-subtracted latents y−μ by a linear transformation of ŷ:

$$\hat{y}=\text{round}(y-\mu-L\hat{y})+\mu+L\hat{y} \quad (27)$$

Here L is a lower-triangular matrix and can be output from the hyperdecoder, or can be a learned model parameter, or can be predicted with a separate neural network. Since ŷ appears on both sides of the above equation, it is implicitly defined.

Learned quantisation and implicit context models can naturally be combined. In this case, the implicit equation becomes $$\hat{y}=\Delta\text{round}\left(\frac{y-\mu-L\hat{y}}{\Delta}\right)+\mu+L\hat{y} \quad (28)$$

One challenge of implicit context modelling is that neural networks need to be trained (carry out an optimisation procedure to find parameters for the network yielding the best possible performance). Standard practice is to use the backpropagation algorithm with an optimisation procedure such as Stochastic Gradient Descent (or one of its close variants). This poses some challenges:

Backpropagation with Stochastic Gradient Descent requires calculating gradients of every transformation in the neural network, but the rounding function is not differentiable.

The Backpropagation algorithm requires using the chain rule from multivariable calculus to "propagate" gradients to every layer in the network. Most automatic differentiation software packages are not able to propagate gradients through implicit equations.

By selecting particular propagating gradients through the rounding operation, we can calculate all gradients of the implicit equation 28, and these gradients take a form that allow us to design an algorithm for propagating gradients through an AI-based compression pipeline that uses this implicit context model with learned quantisation.

The rounding operation may be replaced with "Rounding with a Straight-Through Estimator," which defines the derivatives of the rounding function to ignore the rounding operation:

$$\text{round}(f(x))\rightarrow RoundWithSTE(f(x)), \quad (29)$$

$$\frac{dRoundWithSTE(f(x))}{dx}:=\frac{df(x)}{dx}$$

We can now calculate all derivatives of the implicit equation 28. The simplest way to do this is to define the function:

$$g(y,\mu,L,\Delta,\hat{y}):=L\hat{y} \quad (30)$$

And then our implicit equation becomes $$\hat{y}(y,\mu,\Delta,g)=\Delta RoundWithSTE\left(\frac{y-\mu-g}{\Delta}\right)+\mu+g \quad (31)$$

where ŷ is indicated to be a function of y, μ, Δ, g. Let's calculate the total derivatives w.r.t. each learnable parameter y, μ, L, Δ:

$$\frac{d\hat{y}}{dy}=\frac{\partial\hat{y}}{\partial y}+\frac{\partial\hat{y}}{\partial\mu}\frac{d\mu}{dy}+\frac{\partial\hat{y}}{\partial\Delta}\frac{d\Delta}{dy}+\frac{\partial\hat{y}}{\partial g}\frac{dg}{dy} \quad (32)$$

$$\frac{d\hat{y}}{d\mu}=\frac{\partial\hat{y}}{\partial\mu}+\frac{\partial\hat{y}}{\partial g}\frac{dg}{d\mu} \quad (33)$$

$$\frac{d\hat{y}}{dL}=\frac{\partial\hat{y}}{\partial g}\frac{dg}{dL} \quad (34)$$

$$\frac{d\hat{y}}{d\Delta}=\frac{\partial\hat{y}}{\partial\Delta}+\frac{\partial\hat{y}}{\partial g}\frac{dg}{d\Delta} \quad (35)$$

Calculating the necessary partial derivatives (recall the definition $$\xi:=\frac{y-\mu-g}{\Delta},$$

which is what we encode in the bitstream):

$$\frac{\partial\hat{y}}{\partial y}=\Delta\left(\frac{1}{\Delta}\right)=1 \quad (36)$$

$$\frac{\partial\hat{y}}{\partial\mu}=\Delta\left(\frac{-1}{\Delta}\right)+1=0 \quad (37)$$

$$\frac{\partial\hat{y}}{\partial\Delta}=RoundWithSTE\left(\frac{y-\mu-g}{\Delta}\right)+\Delta\frac{\partial}{\partial\Delta}\left(\frac{y-\mu-g}{\Delta}\right)=\hat{\xi}-\xi \quad (38)$$

$$\frac{\partial\hat{y}}{\partial g}=\Delta\left(\frac{-1}{\Delta}\right)+1=0 \quad (39)$$

Then altogether, the total derivatives are $$\frac{d\hat{y}}{dy}=1+(\hat{\xi}-\xi)\frac{d\Delta}{dy} \quad (40)$$

$$\frac{d\hat{y}}{d\mu}=0 \quad (41)$$

$$\frac{d\hat{y}}{dL}=0 \quad (42)$$

$$\frac{d\hat{y}}{d\Delta}=\hat{\xi}-\xi \quad (43)$$

All multiplication of tensors above is element-wise.

An additional set of gradient calculations arise for the rate loss needed for encoding and decoding the bitstream. Suppose the quantity sent to the entropy model is noise-quantised. Then a typical rate loss in AI-based compression with learned quantisation and using our implicit context model is $$CDF\left(\frac{y-\mu-L\hat{y}+\Delta\odot\epsilon+\Delta/2}{\sigma}\right)-CDF\left(\frac{y-\mu-L\hat{y}+\Delta\odot\epsilon-\Delta/2}{\sigma}\right) \quad (44)$$

where ϵU(−½, ½). The CDF is the cumulative distribution function of some parametric distribution (guassian, laplacian, asymmetric gaussian, guassian mixture, etc.). Let's define $$h^{\pm}(y,\mu,L,\Delta,\hat{y}):=y-\mu-L\hat{y}+\Delta\odot\epsilon\pm\Delta/2 \quad (45)$$

and calculate all gradients as before (the σ gradients basically don't mix with the other gradients, so we skip this calculation). However, unlike before, we'll need to think about matrix calculus when calculating our derivatives. Actually the easiest way is to do it component-wise, so consider the ith element of our vector equation (repeated indices are summed over from now on):

$$h_i^{\pm} = y_i - \mu_i - L_{ij}\hat{y}_j + [\Delta\epsilon]_i \pm \Delta_i/2 \tag{46}$$

The total derivatives are then $$\frac{dh_i^{\pm}}{dy_j} = \frac{\partial h_i^{\pm}}{\partial y_j} + \frac{\partial h_i^{\pm}}{\partial \mu_k}\frac{d\mu_k}{dy_j} + \frac{\partial h_i^{\pm}}{\partial L_{kl}}\frac{\mathrm{dL}_{kl}}{dy_j} + \frac{\partial h_i^{\pm}}{\partial \Delta_k}\frac{d\Delta_k}{dy_j} + \frac{\partial h_i^{\pm}}{\partial \hat{y}_k}\frac{d\hat{y}_k}{dy_j} \tag{47}$$

$$\frac{dh_i^{\pm}}{d\mu_j} = \frac{\partial h_i^{\pm}}{\partial \mu_j} + \frac{\partial h_i^{\pm}}{\partial \hat{y}_k}\frac{d\hat{y}_k}{d\mu_j} \tag{48}$$

$$\frac{dh_i^{\pm}}{\mathrm{dL}_{jm}} = \frac{\partial h_i^{\pm}}{\partial L_{jm}} + \frac{\partial h_i^{\pm}}{\partial \hat{y}_k}\frac{d\hat{y}_k}{\mathrm{dL}_{jm}} \tag{49}$$

$$\frac{dh_i^{\pm}}{d\Delta_j} = \frac{\partial h_i^{\pm}}{\partial \Delta_j} + \frac{\partial h_i^{\pm}}{\partial \hat{y}_k}\frac{d\hat{y}_k}{d\Delta_j} \tag{50}$$

$$\frac{dh_i^{\pm}}{d\hat{y}_j} = \frac{\partial h_i^{\pm}}{\partial \hat{y}_j} \tag{51}$$

We need the following partial derivatives (introducing use of the Kronecker delta):

$$\frac{\partial h_i^{\pm}}{\partial y_j} = \delta_{ij} \tag{52}$$

$$\frac{\partial h_i^{\pm}}{\partial \mu_j} = -\delta_{ij} \tag{53}$$

$$\frac{\partial h_i^{\pm}}{\partial L_{jk}} = -\delta_{ij}\hat{y}_k \tag{54}$$

$$\frac{\partial h_i^{\pm}}{\partial \Delta_j} = \delta_{ij}\epsilon_j \pm \delta_{ij}/2 (\text{no sum on } j \text{ in the first term}) \tag{55}$$

$$\frac{\partial h_i^{\pm}}{\partial \hat{y}_j} = -L_{ij} \tag{56}$$

We've already calculated all of the total derivatives of y when calculating the implicit equation gradients, so now we can substitute everything in:

$$\frac{dh_i^{\pm}}{dy_j} = \delta_{ij} - \frac{d\mu_i}{dy_j} - \hat{y}_k\frac{\mathrm{dL}_{ik}}{dy_j} + (\epsilon_i \pm 1/2)\frac{d\Delta_i}{dy_j} - L_{ik}\frac{d\hat{y}_k}{dy_j} (\text{no sum on } i) \tag{57}$$

$$\frac{dh_i^{\pm}}{d\mu_j} = -\delta_{ij} \tag{58}$$

$$\frac{dh_i^{\pm}}{\mathrm{dL}_{jm}} = -\delta_{ij}\hat{y}_m \tag{59}$$

$$\frac{dh_i^{\pm}}{d\Delta_j} = \delta_{ij}\epsilon_j \pm \delta_{ij}/2 - L_{ik}\frac{d\hat{y}_k}{d\Delta_j} (\text{no sum on } j) \tag{60}$$

$$\frac{dh_i^{\pm}}{d\hat{y}_j} = -L_{ij} \tag{61}$$

Specialization in AI Compression

As discussed above, in AI-based image and video compression, the pipeline may consist of a neural networks, sometimes referred to as models, comprised by several convolutional layers, non-linear activation functions and downsampling/upsampling operations. The pipeline may be split into two components: an encoder part which takes in the original data sample such as the input image or video and returns a latent representation (or latents), and a decoder part whose input is the latents and outputs a (lossy) approximation of the original data sample.

An AI-based compression pipeline trains on a large body of data samples. Conventionally, a training set $$D = (x_1)_{i=1}^{N}$$

should be sufficiently diverse in order for the model to capture multiple modes in the data space, such that the model generalizes across a wide variety of inputs. However, if the data space is incredibly high-dimensional and complex, the multimodality of the data space may force it to overgeneralize which may hurt performance.

Figure 4:
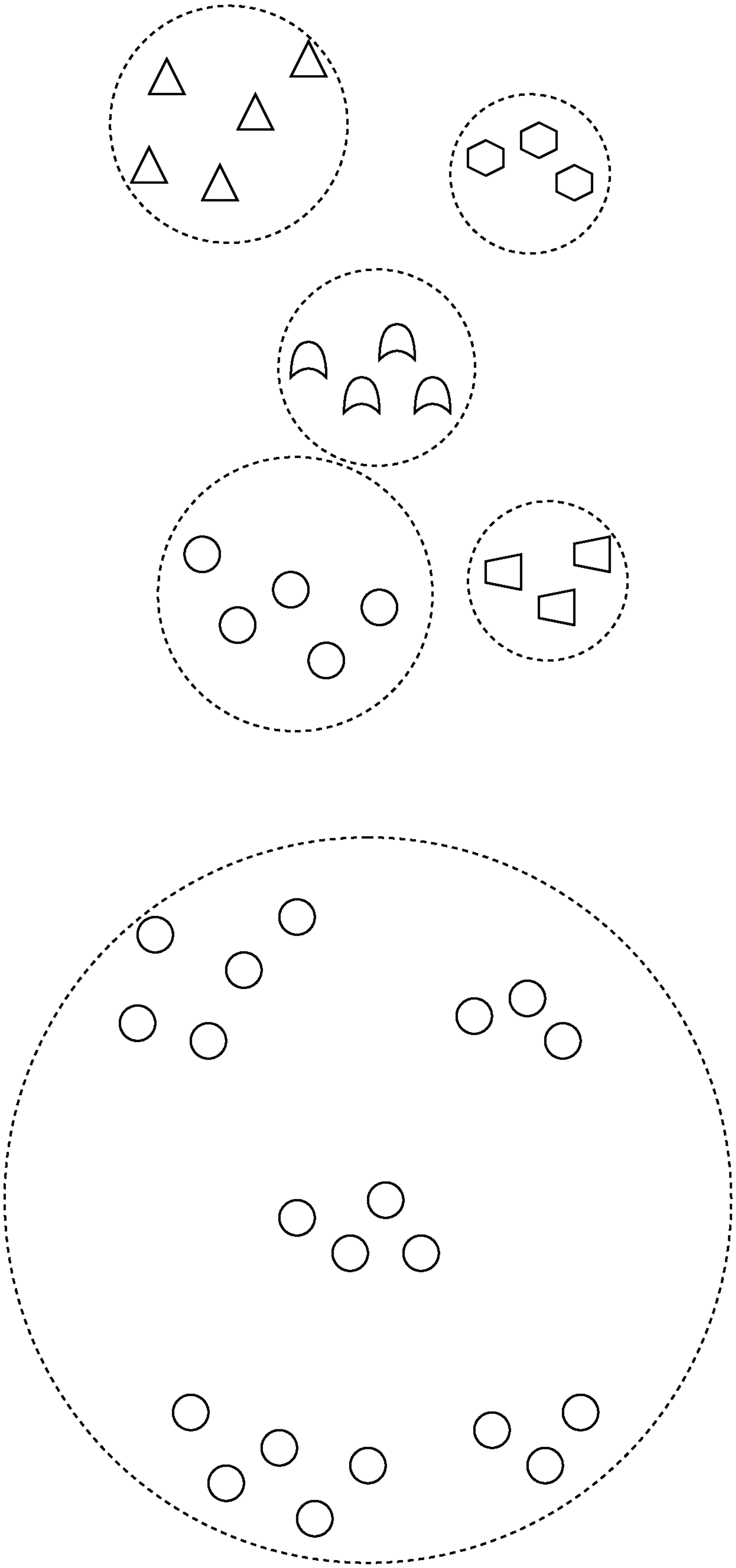
FIG. 4 illustrates generalised and specialised models trained on a dataset D.

This concept is illustrated in FIG. 4. An idealised view of a generalised model trained on the full dataset D is shown on the right and a number of specialised models trained on partitioned datasets of the full dataset D. The models in each case are represented by the dotted lines.

This concept of separating data points of the full dataset into different clusters of data and training separate models on individual clusters may be referred to as specialization.

Specialization in AI-based image and video compression is concerned with pipelines that exploit the inherent multimodality of the data. We expect compression performance to increase significantly through a model capable of identifying the associated mode, or cluster, for each data sample (the cluster model), and a training regime that fits one model for each cluster individually. In other words, we can find a partitioning of the dataset D into K clusters such that each $D_k$ is a mutually exclusive, collectively exhaustive cluster set. Then, we can train one model comprising at least one encoder or decoder or both an encoder and decoder per each cluster to model the cluster individually, as shown on the right side in FIG. 4.

The model architecture of the encoder and/or decoder may be fixed. In this case the weights of a specialised model may simply be hot-swapped in and out of memory, based on the cluster index of each input which can be cheaply encoded in the bitstream.

Training an AI based compression pipeline based on the above concept of specialization consists of two stages: 1. Clustering the dataset into K smaller cluster sets with similar features and 2. Initialising K models, each assigned and trained on a cluster set.

Figure 5:
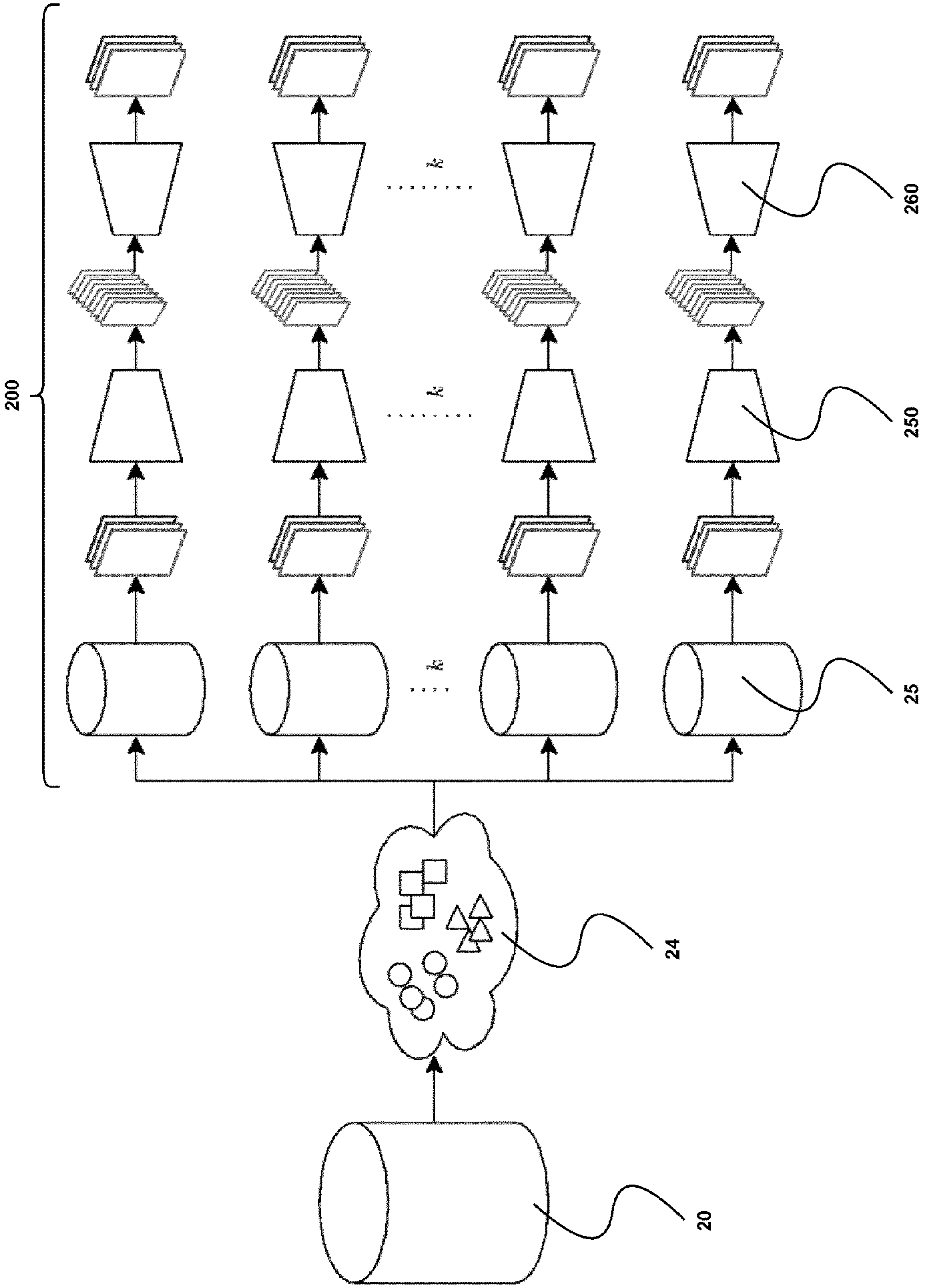
FIG. 5 illustrates an example of the training process of a specialised AI compression process.

A schematic overview of this training process is illustrated in FIG. 5. The first step of specialization is to obtain a cluster model or algorithm 24 that can categorically assign each training and validation instance of the training dataset 20 to a cluster, based on which a compression model may be fit.

One method of using a cluster algorithm is to use a model with pre-defined parameters. Examples of such clustering algorithms are, k-means, Mini-batch k-means, Affinity propagation, Mean-shift, Spectral clustering, Ward hierarchical clustering, Agglomerative clustering, DBSCAN, OPTICS, Gaussian mixtures, BIRCH and Deep Clustering. An example of Deep Clustering is described in Caron, M., Bojanowski, P., Joulin, A. & Douze, M. (2018) Deep Clustering for Unsupervised Learning of Visual Learning, which is hereby incorporated by reference.

The clustering algorithm 24 receives each instance of the training dataset 20 and assigns each instance to a cluster based on one or more feature of the instance. In the case of input images, the clustering algorithm may perform the assignment based on one ore more of the following features: RGB channel statistics (mean, variance, higher-order moments), RGB colour histogram probabilities, Channel statistics and histogram probabilities in other colour spaces, 1-D power spectral density, Neural network-based classifier probabilities, File metadata and Deep features. The number of clusters to which instances are assigned may be predetermined. In the case where neural network-based classifier probabilities are used, the neural network used may be trained before the training of the compression models described below. In this case, the neural network is trained in advance on the training dataset 20.

As an alternative, the clustering may be performed by a neural network that is trained end-to-end together with the compression models which will be described below. Examples of backpropable clustering methods includes: Hard cluster assignments in the forward pass, and soft cluster assignments in the backward pass, Gumbel-softmax reparameterization as described in Jang, E., Gu, S. & Poole, B. (2016) Categorical Reparameterization with Gumbel-Softmax, which is hereby incorporated by reference, and Deep Clustering.

Once the clustering algorithm has been performed, the next step is specialised network training. With an appropriate clustering model or algorithm, we can associate each data sample of the training dataset 20 to the assigned cluster and retrieve K cluster sets 25 for training a plurality of specialised compression pipelines 200. Each specialised compression pipeline 200 comprises a separate encoder 250 and decoder 260. Each specialised compression pipeline 200 may be initialised from scratch rather than restarted from a pre-trained model. If trained with adversarial loss, a separate discriminator should be used for each cluster set 25. Each specialised pipeline may then be trained on the set of instances assigned to its associated cluster, as described above.

Once the plurality of pipelines has been trained, in operation the clustering algorithm 24 receives an input image and assigns the input image to a particular cluster. Based on the assigned cluster, a particular specialised pipeline is selected for the encoding, transmission and decoding of the input image. The cluster index selected by the clustering algorithm may be sent as meta-data in addition to the latent representation of the image so that the correct decoder 260 may be selected at the receiving end.

The network architecture is not restricted to be the same across the compression pipelines associated with each of the cluster sets and can be treated as a separate hyperparameter optimisation step after the cluster analysis. However, from an operational standpoint it may be more efficient for the encoder and/or decoder architecture to be similar or identical across one or more of the cluster sets, which would enable network parameters to be loaded in and out of computation graphs on mobile hardware more efficiently.

A generalised compression pipeline can also be combined to work in conjunction with several specialised compression pipelines. Such a model would act as a fallback option in case the compression performance for a particular data sample proves to be worse on the specialised pipeline than the generalised one. To obtain this model, training can be performed for a compression pipeline on the training dataset 20 without the use of the clustering algorithm.

With the concept of specialisation, we can build domain or media category-specific pipelines.

For instance, one compression model can specialize on films, one for sports, one on videoconferencing, one generalised fallback model and so on. We could even consider a hierarchical structure, performing an additional level of clustering on a subcategory of the media, such as one model per film genre (action, animated, horror, sci-fi), one model per individual sports (football, skiing, boxing).

An alternative approach discussed above is to be domain-agnostic and let a deep clustering model or feature extractor, for example a neural network, decide the data partitioning. In this approach, the neural network receives an input image as an input and the further clustering algorithm may be applied to the output of the neural network to obtain the appropriate cluster. The input image may then pass through the associated compression pipeline as discussed above. In this approach, the neural network may be trained to produce outputs that result in better clustering of the input images by the clustering algorithm. For example, the loss function used to train the neural network may be based on the variance between the outputs of the neural network to encourage differences in the output. The neural network may the encoder of an autoencoder system, with the output subsequently used as an input to a decoder where the output is an approximation of the input image.

The image may be divided into a number of sub-images which are used as an input to the system. Each of the sub-images may be the same size. For example, we can macro-block each image into smaller, fixed-resolution contiguous blocks of 32×32 pixels, and identify and train K specialised models each of which takes in 32×32 pixel inputs. This approach may be performed when a neural network decides the data partitioning before clustering, as described above. In this approach, each block would be processed with a specialised transform coding algorithm, best suited for that block.

Figure 6:
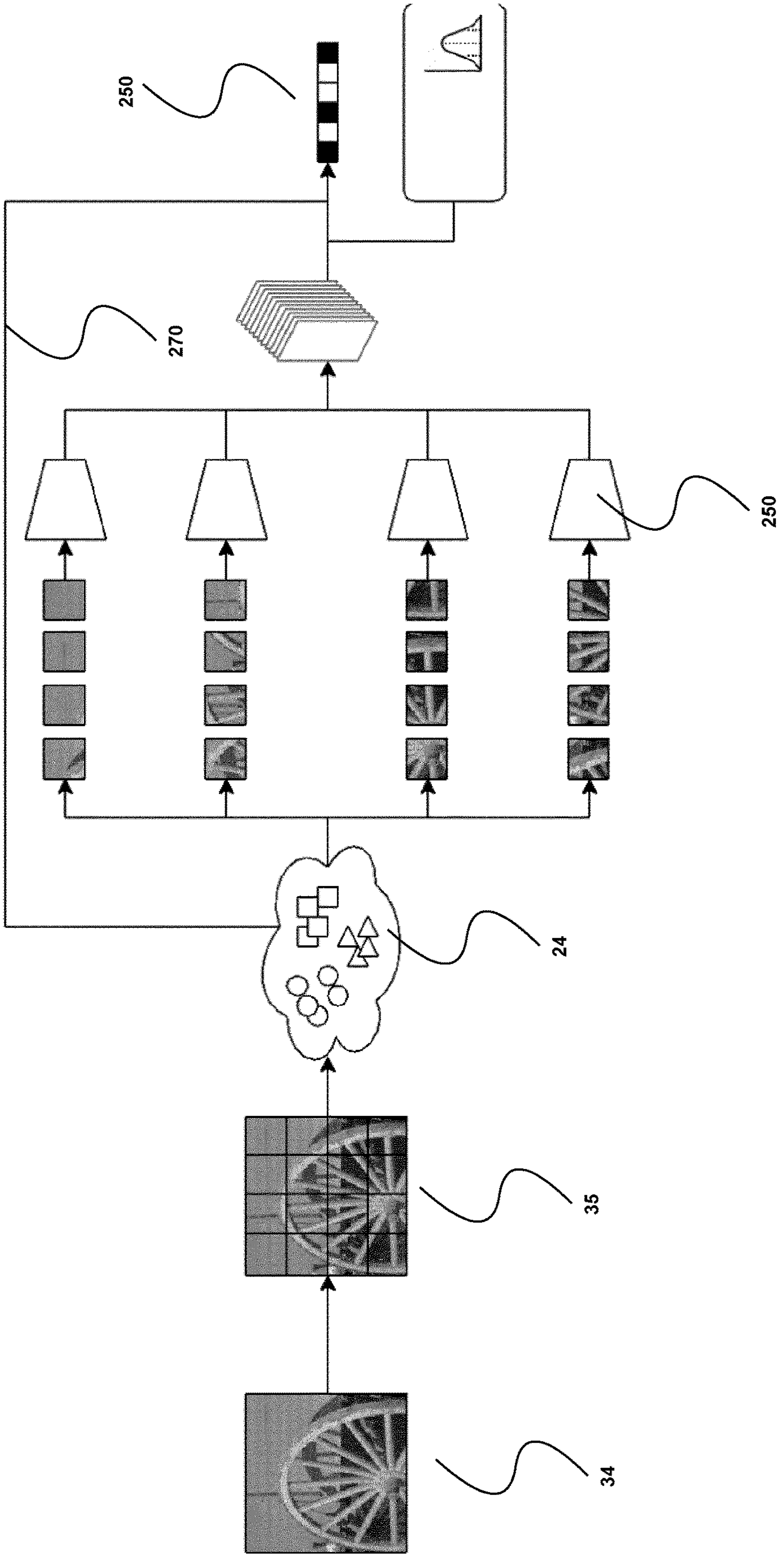
FIG. 6 illustrates an example of the encoding process of a specialised AI compression process.

An example visualisation of such an encoding system is shown in FIG. 6. An initial image 34 is divided into a plurality of sub-images or blocks 35. Each of the sub-images 35 are assigned clusters by the clustering algorithm 24 and encoded by the associated encoder 250 of the cluster to produce a plurality of latent representations associated with the plurality of sub-images 35.

For such a system, it may be, beneficial to bring or combine the latent components from each block together in the latent space for efficient entropy modelling during transmission through the bitstream 250. For this, we can stitch back the latent blocks outputted from each encoder in a pre-determined arrangement. We can also leverage techniques from Dosovitskiy, A., Beyer, L., Kolesnikov, A., Weissenborn, D., Zhai, X., Unterthiner, T., Dehghani, M., Minderer, M., Heigold, G., Gelly, S., Uszkoreit, J. & Houlsby, N. (2020) An Image is Worth 16×16 Words: Transformers for Image Recognition at Scale and Wu, B., Xu, C., Dai, X., Wan, A., Zhang, P., Yan, Z., Tomizuka, M., Gonzalez, J., Keutzer, K. & Vajda, P. (2020) Visual Transformers: Token-based Image Representation and Processing for Computer Vision, which are hereby incorporated by reference, and treat each latent block as a token in order to model inter-block dependencies.

The cluster index used for each instance may be included in the bitstream in a particular step 270 from the clustering algorithm. Luckily, this is barely one byte per patch, which is a fixed number of bits per pixel (bpp) depending only on the patch size and the number of specialised models (for K=100 and 32×32 patches, the constant bpp for the cluster index encoding may be 0.0068.).

Figure 7:
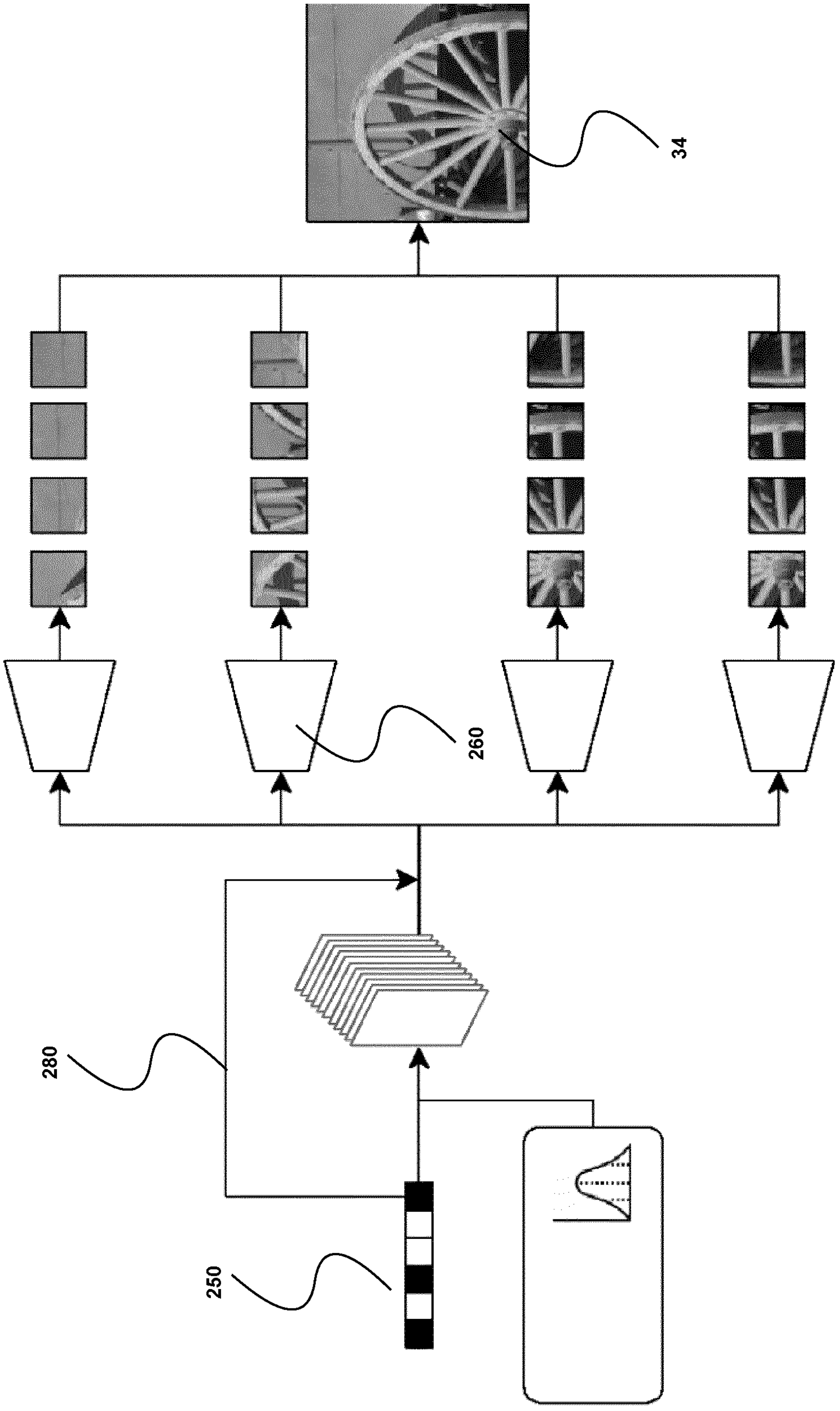
FIG. 7 illustrates an example of the decoding process of a specialised AI compression process.
Figure 8:
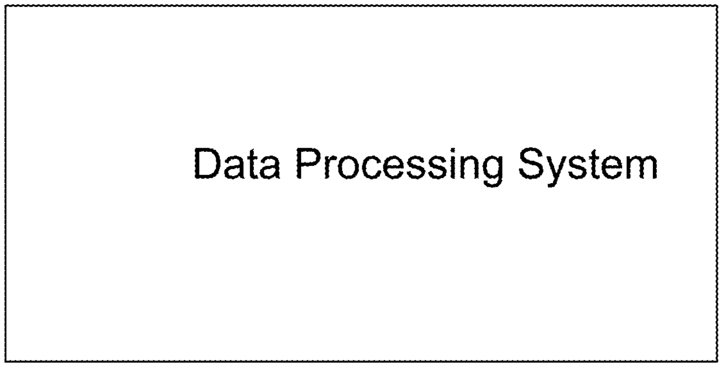
FIG. 8 illustrates a schematic diagram of a data processing system configured to perform a method of training one or more neural networks, the one or more neural networks being for use in lossy image or video encoding, transmission and decoding, the method comprising the steps of: receiving an input image at a first computer system; encoding the input image using a first neural network to produce a latent representation; and decoding the latent representation using a second neural network to produce an output image, wherein the output image is an approximation of the input image; wherein the first neural network and the second neural network each comprise a plurality of layers; at least one of the plurality of layers of the first or second neural network comprises a transformation, wherein the output of the transformation is a feature map; and the method further comprises the steps of: evaluating a difference between the output image and the input image and evaluating a function based on the feature map; updating the parameters of the first neural network and the second neural network based on the evaluated difference and the evaluated function; and repeating the above steps using a first set of input images to produce a first trained neural network and a second trained neural network.

An example visualisation of a corresponding decoding system to the example of FIG. 6 is shown in FIG. 7. In the decoding system, as illustrated in FIG. 7, the indices are retrieved from the bitstream in a step 280. Each block is processed through a corresponding specialised decoder, after which the image is stitched back together and may be post-processed with a border-removal filter.

An example of the results obtain using a specialised pipeline is provided below. 16M pre-processed 256×256 image crops were processed using the clustering algorithm MiniBatchK-Means to form 'K=100' clusters, each attributed to a cluster index of 0-99. Corresponding specialised compression pipelines consisting of a 7E6D128 architecture were trained on each cluster. The generalised model was trained against the entire uncropped image dataset. A sample of cluster results are provided.

| Validation set | | Generalised model | Specialised model | Percentage difference |
|---|---|---|---|---|
| Cluster a | BPP | 0.113 | 0.099 | −12.6% |
| | MSE | 48.8 | 48.6 | −0.5% |
| Cluster b | BPP | 0.029 | 0.024 | −18.8% |
| | MSE | 10.7 | 7.4 | −30.7% |
| Cluster c | BPP | 0.151 | 0.143 | −5.0% |
| | MSE | 78.2 | 62.1 | −20.5% |
| Cluster d | BPP | 0.175 | 0.165 | −5.6% |
| | MSE | 137.3 | 136.9 | −0.3% |

As can be seen, the specialised model outperforms the generalised model on each cluster both in rate and distortion performance.

We claim:

1. A method of training one or more neural networks comprising the steps of:

a) receiving an input image at a first computer system;

b) encoding the input image using a first neural network to produce a latent representation;

c) decoding the latent representation using a second neural network to produce an output image, wherein the output image is reconstruction of the input image;

wherein the first neural network and the second neural network each comprise a plurality of layers;

at least one of the plurality of layers of the first or second neural network comprises a transformation, wherein the output of the transformation is a pre-activation feature map;

d) evaluating a function comprising a term which is a function of a difference between the output image and the input image, a term which is the mean of the element-wise squares of the pre-activation latent representation and a term which is a function of the feature map;

e) updating the parameters of the first neural network and the second neural network based on the evaluated function; and f) repeating the steps a) to e) a plurality of times until the evaluated function reaches a minima using a first set of input images to produce a first trained neural network and a second trained neural network.

2. The method of claim 1, wherein the term which is the mean of the element-wise squares of the pre-activation feature map is a sum of the mean of the element-wise squares of a plurality of pre-activation feature maps, wherein each feature map is in a different layer of the plurality of layers of the first or second neural network.

3. The method of claim 2, wherein the contribution of each of the sum of the mean of the element-wise squares of the plurality of pre-activation feature maps to the term is scaled by a predetermined value.

4. The method of claim 1, wherein the contribution of the term which is the mean of the element-wise squares of the pre-activation feature map to the update to the parameters of the first neural network and the second neural network is scaled by a predetermined value.

5. The method of claim 1, wherein the contribution of the term which is the mean of the element-wise squares of the pre-activation feature map to the update to the parameters of the first neural network and the second neural network is scaled by a value; and the value is additionally updated in at least one of the plurality of repetitions of steps a) to e).

6. The method of claim 1, wherein the transformation of the at least one of the plurality of layers of the first or second neural network is an affine linear transformation.

7. A non-transitory, computer-readable storage medium comprising instructions which, when executed by a computer, cause the computer to perform the method of claim 1.

* * * * *